US009236244B2

(12) United States Patent  (10) Patent No.: US 9,236,244 B2
Chandrasekharan et al.  (45) Date of Patent: *Jan. 12, 2016

(54) SEQUENTIAL PRECURSOR DOSING IN AN ALD MULTI-STATION/BATCH REACTOR

(71) Applicant: Lam Research Corporation, Fremont, CA (US)

(72) Inventors: Ramesh Chandrasekharan, Portland, OR (US); Adrien LaVoie, Newberg, OR (US); Damien Slevin, Salem, OR (US); Karl Leeser, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/571,191

(22) Filed: Dec. 15, 2014

(65) Prior Publication Data

US 2015/0099372 A1 Apr. 9, 2015

Related U.S. Application Data

(63) Continuation of application No. 14/133,246, filed on Dec. 18, 2013, now Pat. No. 8,940,646.

(60) Provisional application No. 61/845,911, filed on Jul. 12, 2013.

(51) Int. Cl.
*H01L 21/31* (2006.01)
*C23C 16/00* (2006.01)
(Continued)

(52) U.S. Cl.
CPC .......... *H01L 21/0228* (2013.01); *C23C 16/458* (2013.01); *C23C 16/45527* (2013.01);
(Continued)

(58) Field of Classification Search
CPC ................ C23C 16/45527; C23C 16/45542; H01L 21/0228; H01L 21/67207; H01L 21/02164; H01L 21/022; H01L 21/02208; H01L 21/02274
USPC ......... 438/791, 762, 763, 787, 788, 789, 790; 118/715, 719, 723 R
See application file for complete search history.

(56) References Cited

U.S. PATENT DOCUMENTS 6,800,173 B2  10/2004  Chiang et al.
6,902,620 B1  6/2005  Omstead et al.
(Continued)

OTHER PUBLICATIONS

U.S. Appl. No. 14/133,246, title Sequential Precursor Dosing in an ALD Multi-Station/Batch Reactor, by Ramesh Chandrasekharan, et al., filed Dec. 18, 2013.
(Continued)

*Primary Examiner* — Kevin M Picardat
(74) *Attorney, Agent, or Firm* — Weaver Austin Villeneuve & Sampson LLP

(57) ABSTRACT

Disclosed herein are methods of depositing layers of material on multiple semiconductor substrates at multiple processing stations within one or more reaction chambers. The methods may include dosing a first substrate with film precursor at a first processing station and dosing a second substrate with film precursor at a second processing station with precursor flowing from a common source, wherein the timing of said dosing is staggered such that the first substrate is dosed during a first dosing phase during which the second substrate is not substantially dosed, and the second substrate is dosed during a second dosing phase during which the first substrate is not substantially dosed. Also disclosed herein are apparatuses having a plurality of processing stations contained within one or more reaction chambers and a controller with machine-readable instructions for staggering the dosing of first and second substrates at first and second processing stations.

20 Claims, 10 Drawing Sheets

(51) Int. Cl.
*H01L 21/02* (2006.01)
*H01L 21/67* (2006.01)
*C23C 16/458* (2006.01)
*C23C 16/505* (2006.01)
*C23C 16/52* (2006.01)
*C23C 16/455* (2006.01)

(52) U.S. Cl.
CPC ..... *C23C16/45542* (2013.01); *C23C 16/45544* (2013.01); *C23C 16/45561* (2013.01); *C23C 16/505* (2013.01); *C23C 16/52* (2013.01); *H01L 21/022* (2013.01); *H01L 21/0217* (2013.01); *H01L 21/02164* (2013.01); *H01L 21/02208* (2013.01); *H01L 21/02274* (2013.01); *H01L 21/67207* (2013.01)

(56) References Cited

U.S. PATENT DOCUMENTS

| | | | |
|---|---|---|---|
| 6,984,591 | B1 | 1/2006 | Buchanan et al. |
| 7,189,432 | B2 | 3/2007 | Chiang et al. |
| 7,318,869 | B2 | 1/2008 | Chiang et al. |
| 7,806,983 | B2 | 10/2010 | Chiang et al. |
| 8,168,269 | B2 | 5/2012 | Mahajani et al. |
| 8,309,374 | B2 | 11/2012 | Porthouse et al. |
| 8,367,565 | B2 | 2/2013 | Lei et al. |
| 8,529,990 | B2 | 9/2013 | Fedorovskaya et al. |
| 8,940,646 | B1 * | 1/2015 | Chandrasekharan ......... H01L 21/0228 118/715 |
| 2002/0144657 | A1 | 10/2002 | Chiang et al. |
| 2005/0016471 | A1 | 1/2005 | Chiang et al. |
| 2007/0259111 | A1 | 11/2007 | Singh et al. |
| 2008/0066678 | A1 | 3/2008 | Bluck et al. |
| 2009/0035946 | A1 | 2/2009 | Pierreux et al. |
| 2009/0081356 | A1 | 3/2009 | Fedorovskaya et al. |
| 2011/0217469 | A1 | 9/2011 | Lei et al. |
| 2012/0192792 | A1 | 8/2012 | Mahajani et al. |
| 2013/0093049 | A1 | 4/2013 | Ananthan et al. |
| 2013/0333768 | A1 | 12/2013 | Chandrasekharan et al. |

OTHER PUBLICATIONS

Notice of Allowance dated Sep. 16, 2014, issued in U.S. Appl. No. 14/133,246.

* cited by examiner

SEQUENTIAL PRECURSOR DOSING IN AN ALD MULTI-STATION/BATCH REACTOR

RELATED APPLICATIONS

This application is a continuation of and claims priority to U.S. patent application Ser. No. 14/133,246, filed Dec. 18, 2013, titled "SEQUENTIAL PRECURSOR DOSING IN AN ALD MULTI STATION/BATCH REACTOR," which claims the benefit of priority to U.S. Provisional Patent Application No. 61/845,911, filed Jul. 12, 2013, and titled "SEQUENTIAL PRECURSOR DOSING IN AN ALD MULTI-STATION/BATCH REACTOR," all of which are hereby incorporated by reference in their entireties and for all purposes.

BACKGROUND

In the fabrication of integrated circuits (ICs), it is oftentimes desirable to deposit a thin film of material which substantially conforms to the shape of features already present on the surface of a partially manufactured semiconductor wafer. While there are various ways of depositing films of material on a semiconductor such as physical vapor deposition (PVD), chemical vapor deposition (CVD), plasma-enhanced chemical vapor deposition (PECVD), etc., these methodologies often result in the formation of layers not sufficiently conformal with the underlying material. Atomic layer deposition (ALD), on the other hand, does typically provide for the deposition of thin films with the desired degree of conformality.

ALD achieves its characteristic conformality by depositing material in thin adsorption-limited layers. Since each deposited layer is formed through an adsorption-limited process, each layer is of approximately the same thickness, and thicker films of the deposited material consisting of multiple layers may be thus formed through consecutive ALD cycles, thereby producing a film which conforms to the shape of the underlying substrate surface.

SUMMARY

Disclosed herein are methods of depositing layers of material on multiple semiconductor substrates at multiple processing stations within one or more reaction chambers. The methods may include dosing the substrates at the processing stations with a film precursor by introducing the precursor into the one or more reaction chambers and allowing the precursor to adsorb onto the surface of the substrates in an adsorption-limited manner, and then removing unadsorbed precursor from the volumes surrounding the processing stations inside the one or more reaction chambers. The dosing of the substrates at the processing stations with film precursor may include dosing a first substrate at a first processing station and a second substrate at a second processing station with precursor flowing from a common source. The timing of said dosing may be staggered such that the first substrate is dosed during a first dosing phase during which the second substrate is not substantially dosed, and the second substrate is dosed during a second dosing phase during which the first substrate is not substantially dosed, wherein the precursor flows continuously from the common source during the first and second dosing phases. The methods may further include reacting adsorbed precursor with a plasma, after removing unadsorbed precursor, to form a layer of material on the substrates, and removing desorbed precursor and/or reaction by-product from the volumes surrounding the processing stations inside the one or more reaction chambers when present after reacting adsorbed precursor. Thereafter, the methods may further include repeating the foregoing operations multiple times to form multiple layers of material on the multiple substrates at the multiple processing stations.

Also disclosed herein are multi-station substrate processing apparatuses for depositing layers of material on multiple semiconductor substrates at multiple processing stations. The apparatuses may include a plurality of processing stations each having a substrate holder contained within one or more reaction chambers, a valve assembly for directing flow of film precursor to each of the processing stations and to a precursor-divert flow path, a valve-operated vacuum source for removing precursor from the volumes surrounding the processing stations inside the one or more reaction chambers, and a controller comprising machine-readable instructions for operating the valve assembly and vacuum source. The controller may including instructions for dosing substrates at the processing stations with film precursor by introducing the precursor into the one or more reaction chambers and allowing the precursor to adsorb onto the surface of the substrates in an adsorption-limited manner, instructions for removing unadsorbed precursor from the volumes surrounding the processing stations inside the one or more reaction chambers, instructions for reacting adsorbed precursor with a plasma, after removing unadsorbed precursor, to form a layer of material on the substrates, instructions for removing desorbed precursor and/or reaction by-product from the volumes surrounding the processing stations inside the one or more reaction chambers when present after reacting adsorbed precursor, and instructions for repeating (i) through (iv) multiple times to form multiple layers of material on the multiple substrates at the multiple processing stations. The dosing of the substrates at the processing stations with film precursor may include dosing a first substrate at a first processing station of the plurality of processing stations and dosing a second substrate at a second processing station of the plurality of processing stations with precursor flowing from a common source. The timing of said dosing may be staggered such that the first substrate is dosed during a first dosing phase during which the second substrate is not substantially dosed, and the second substrate is dosed during a second dosing phase during which the first substrate is not substantially dosed, and wherein the precursor flows continuously from the common source during the first and second dosing phases.

DETAILED DESCRIPTION

Figure 1:
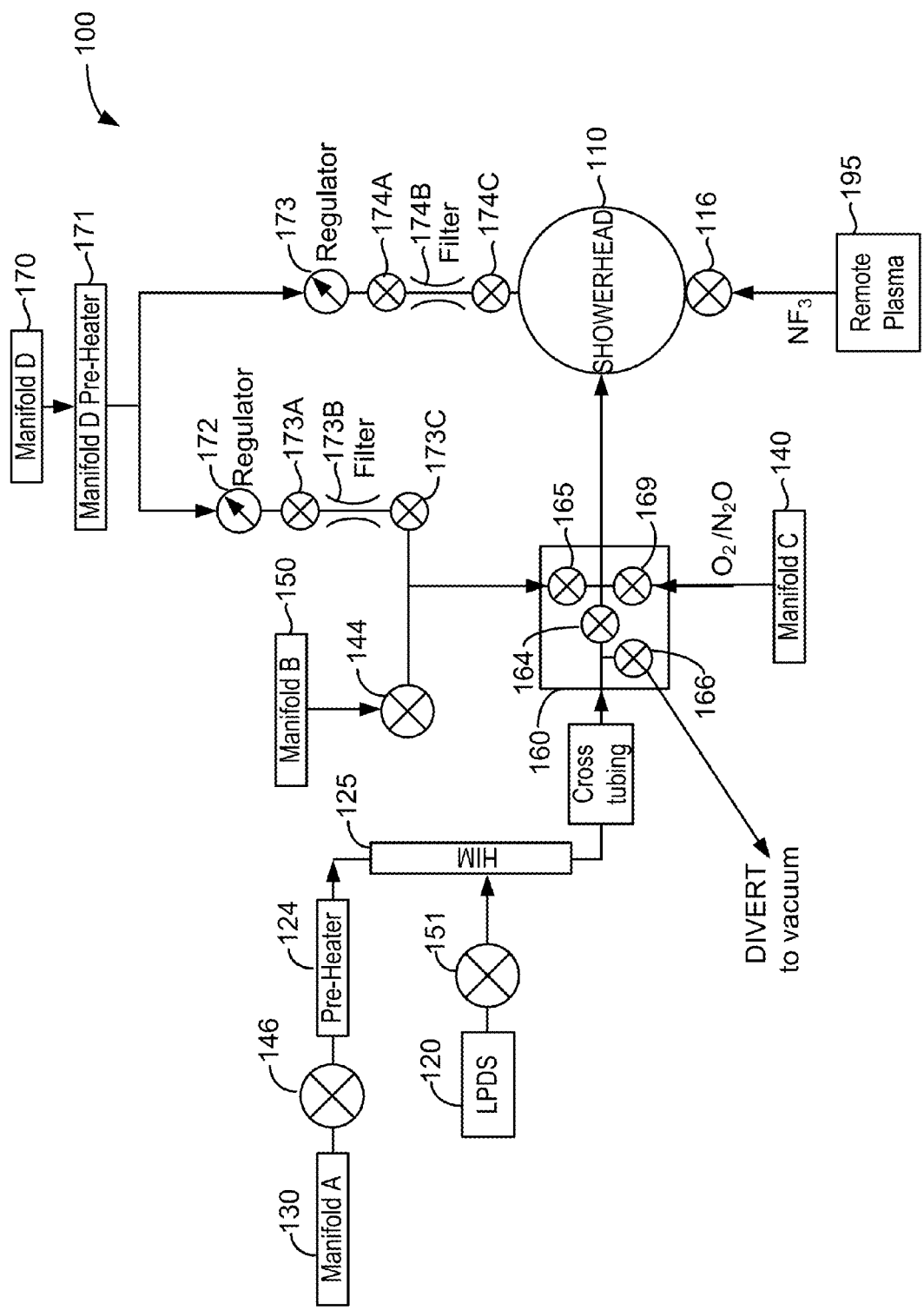
FIG. 1 schematically illustrates a gas delivery system for delivering reactants to a single processing station of a multi-station substrate processing apparatus which may be used to perform one or more ALD cycles.

In the following description, numerous specific details are set forth in order to provide a thorough understanding of the present invention. The present invention may be practiced without some or all of these specific details. In other instances, well known process operations have not been described in detail so as to not unnecessarily obscure the present invention. While the invention will be described in conjunction with specific detailed embodiments, it is to be understood that these specific detailed embodiments are not intended to limit the scope of the inventive concepts disclosed herein.

As described above, ALD provides an effective avenue for depositing conformal films of dielectric material, however, due to the adsorption-limited nature of the process, each ALD cycle only deposits a thin film of material. Thus, the sequence of steps in a typical ALD cycle which result in the formation of a single adsorption-limited monolayer of material are generally repeated multiple times to form a conformal film of desired thickness. For example, as described in more detail in U.S. patent application Ser. No. 13/084,399, filed Apr. 11, 2011, titled "PLASMA ACTIVATED CONFORMAL FILM DEPOSITION," U.S. patent application Ser. No. 13/242,084, filed Sep. 23, 2011, titled "PLASMA ACTIVATED CONFORMAL DIELECTRIC FILM DEPOSITION," and U.S. patent application Ser. No. 13/224,240, filed Sep. 1, 2011, and titled "PLASMA ACTIVATED CONFORMAL DIELECTRIC FILM DEPOSITION," (each of which is hereby incorporated by reference in its entirety for all purposes), an ALD cycle for depositing a dielectric material (such as a silicon-containing dielectric material) may comprise: (i) dosing a substrate at a processing station within a reaction chamber with a dielectric film precursor and allowing the precursor to adsorb onto the surface of the substrate in an adsorption-limited manner, (ii) removing (e.g. via purging) unadsorbed precursor and/or reaction by-product from the reaction chamber, or more specifically, from the volume surrounding the processing station, (iii) reacting the adsorbed-precursor with an oxidative plasma typically generated in the reaction chamber with application of suitable RF power (although in some embodiments, it may be generated remotely), and finally, (iv) removing (again, often by purging) any desorbed dielectric film precursor (or other reactants or materials) from the reaction chamber, or more specifically, from the volume surrounding the processing station (where the substrate is located). Operations (i) through (iv) may then be repeated multiple times to form multiple layers of dielectric material to form a film of dielectric material of the desired thickness. In some dielectric film forming chemistries, an auxiliary reactant or co-reactant—in addition to what is referred to as the dielectric film "precursor"—may also be employed. In certain such embodiments, the auxiliary reactant or co-reactant may be flowed continuously during a subset of steps (i) through (iv) or throughout each of steps (i) through (iv).

As described in the patent applications listed and incorporated by reference above (U.S. patent application Ser. Nos. 13/084,399, 13/242,084, and 13/224,240), various film-forming chemistries may be used to deposit various film types via the ALD processes described herein. For instance, any appropriate silicon-containing reactant/film-precursor and oxidant may be used for the deposition of silicon oxides. Similarly, for the deposition of silicon nitrides, any appropriate silicon-containing reactant/film-precursor and nitrogen-containing co-reactant may be used. Further, for the deposition of metal oxides or metal nitrides, any appropriate metal-containing reactants/film-precursor and co-reactants may be used. Examples of auxiliary/co-reactants include oxygen, ozone, hydrogen, carbon monoxide, nitrous oxide, ammonia, alkyl amines, and the like. For example, an oxide film may be deposited by an ALD process using bis(tert-butylamino)silane (BTBAS) as a silicon-containing film precursor. In this example, oxygen or nitrous oxide may be used as an oxidant, e.g. in ALD step (iii), which may or may not, depending on the embodiment, flow continuously during delivery of the BTBAS (ALD step (i)).

Generally, the disclosed multi-substrate deposition methodologies and related apparatuses employing various process timing sequences are applicable to a wide variety of deposited film types and deposition chemistries. The disclosed ALD processes may be employed to form films of dielectric material, but films of conductive and semiconductor material may be formed as well, depending on the embodiment. Nitrides and oxides are featured dielectric materials, but carbides, oxynitrides, carbon-doped oxides, borides, etc. may also be formed. Oxides include a wide range of materials including undoped silicate glass (USG) and doped silicate glass. Examples of doped silicate glasses included boron doped silicate glass (BSG), phosphorus doped silicate glass (PSG), and boron phosphorus doped silicate glass (BPSG).

A "silicon-containing film precursor" is a compound and/or reagent containing silicon which may be used to form a film incorporating silicon from said precursor. The silicon-containing film precursor may be, for example, a silane, a halosilane or an aminosilane. A silane contains hydrogen and/or carbon groups, but does not contain a halogen. Examples of silanes are silane ($SiH_4$), disilane ($Si_2H_6$), and organo silanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like. A halosilane contains at least one halogen group and may or may not contain hydrogens and/or carbon groups. Examples of halosilanes are iodosilanes, bromosilanes, chlorosilanes and fluorosilanes. Although halosilanes, particularly fluorosilanes, may form reactive halide species that can etch silicon materials, in certain embodiments, the silicon-containing film precursor is not present when a plasma is struck. Specific chlorosilanes are tetrachlorosilane ($SiCl_4$), trichlorosilane ($HSiCl_3$), dichlorosilane ($H_2SiCl_2$), monochlorosilane (ClSiH$_3$), chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like. An aminosilane includes at least one nitrogen atom bonded to a silicon atom, but may also contain hydrogens, oxygens, halogens and carbons. Examples of aminosilanes are mono-, di-, tri- and tetra-aminosilane (H$_3$Si(NH$_2$)$_4$, H$_2$Si(NH$_2$)$_2$, HSi(NH$_2$)$_3$ and Si(NH$_2$)$_4$, respectively), as well as substituted mono-, di-, tri- and tetra-aminosilanes, for example, t-butylaminosilane, methylaminosilane, tert-butylsilanamine, bis(tertiarybutylamino)silane (SiH$_2$(NHC(CH$_3$)$_3$)$_2$ (BTBAS), tert-butyl silylcarbamate, SiH(CH$_3$)—(N(CH$_3$)$_2$)$_2$, SiHCl—(N(CH$_3$)$_2$)$_2$, (Si(CH$_3$)$_2$NH)$_3$ and the like. A further example of an aminosilane is trisilylamine (N(SiH$_3$)$_3$).

In some embodiments, the deposited film contains metal. Examples of metal-containing films that may be formed include oxides and nitrides of aluminum, titanium, hafnium, tantalum, tungsten, manganese, magnesium, strontium, etc., as well as elemental metal films. Example of metal-containing film precursors may include metal alkylamines, metal alkoxides, metal alkylamides, metal halides, metal β-diketonates, metal carbonyls, organometallics, etc. Appropriate metal-containing film precursors will include the metal that is desired to be incorporated into the film. For example, a tantalum-containing layer may be deposited by reacting pentakis (dimethylamido)tantalum with ammonia or another reducing agent. Further examples of metal-containing precursors that may be employed include trimethylaluminum, tetraethoxytitanium, tetrakis-dimethyl-amido titanium, hafnium tetrakis (ethylmethylamide), bis(cyclopentadienyl)manganese, bis (n-propylcyclopentadienyl)magnesium, etc.

In some embodiments, the deposited film contains nitrogen, and a nitrogen-containing co-reactant may be used. A "nitrogen-containing co-reactant" contains at least one nitrogen, for example, ammonia, hydrazine, amines (e.g., amines bearing carbon) such as methylamine, dimethylamine, ethylamine, isopropylamine, t-butylamine, di-t-butylamine, cyclopropylamine, sec-butylamine, cyclobutylamine, isoamylamine, 2-methylbutan-2-amine, trimethylamine, diisopropylamine, diethylisopropylamine, di-t-butylhydrazine, as well as aromatic containing amines such as anilines, pyridines, and benzylamines. Amines may be primary, secondary, tertiary or quaternary (for example, tetraalkylammonium compounds). A nitrogen-containing co-reactant may contain heteroatoms other than nitrogen, for example, hydroxylamine, t-butyloxycarbonyl amine and N-t-butyl hydroxylamine are nitrogen-containing reactants.

In certain embodiment, an oxygen-containing oxidizing reactant is used. Examples of oxygen-containing oxidizing reactants include oxygen, ozone, nitrous oxide, carbon monoxide, mixtures thereof, etc.

Again, multiple ALD cycles may be repeated to build up stacks of conformal layers. In some embodiments, each layer may have substantially the same composition whereas in other embodiments, sequentially ALD deposited layers may have differing compositions, or in certain such embodiments, the composition may alternate from layer to layer or there may be a repeating sequence of layers having different compositions. Again, certain such embodiments are described in greater detail in U.S. patent application Ser. No. 13/242,084 (incorporated by reference above). It should also be noted that although the ALD-related techniques, operations, methodologies, apparatuses, devices. and systems disclosed herein are described in the context of depositing layers of silicon-containing film, and in particular silicon-containing dielectric films, and yet more particularly silicon oxide and/or silicon nitride-containing dielectric films, it should be understood that the disclosed techniques, methodologies, apparatuses, and systems disclosed herein may also be used to deposit other types of dielectric films, or generally, other films having different chemistries formed from different types of chemical precursors and reactants.

Schematically illustrated in FIG. 1 is a gas delivery system 100 for delivering reactants to a single station of a multi-station reaction chamber (not shown) which may be used to perform one or more ALD cycles. The figure illustrates a configuration of gas flow lines, manifolds, valves, regulators, filters, showerhead, etc. for providing for ALD reactant delivery. Gas lines are schematically indicated as thin solid lines with arrows indicating the direction of gas flow; valves are indicted in the figure with crossed lines within a circle; regulators by an arrow within a circle; manifolds by solid boxes labeled "Manifold"; filters with curved lines either side of a gas line, etc. Most of the gas flow lines route gas to the "showerhead" 110, which as shown in this schematic, is the device which delivers the ALD reactants to a reaction chamber which is not shown.

Thus, in reference to the particular embodiment of a gas delivery system 100 shown in FIG. 1, the delivery of film precursor (e.g., silicon-containing film precursor) to the reaction chamber—relevant to the ALD dosing and adsorption step (see step (i) above)—may involve introducing precursor from a liquid delivery system (labeled "LPDS") 120 to a heated injection manifold 125 (labeled "HIM") where it is mixed with a preheated (see "preheater" 124) inert carrier gas originating from gas source 130 ("Manifold A"). The carrier gas then carries the precursor to an array of four valves 169, 164, 165, 166 which as an assembly 160 is often referred to as a point-of-use valve manifold (PVM) due to its close proximity (in terms of gas flow distance) to the reaction chamber. In particular, from the PVM 160, with valve 165 open and valve 166 closed, the precursor and carrier gas are flowed directly to the showerhead 110 and then into the reaction chamber. Examples of suitable PVMs which may include the aforementioned four valves 164, 165, 166, 169 are described in U.S. patent application Ser. No. 13/626,717, filed Sep. 25, 2012, and titled "POINT OF USE VALVE MANIFOLD FOR SEMICONDUCTOR FABRICATION EQUIPMENT," hereby incorporated by reference in its entirety and for all purposes).

Likewise, delivery system 100 of FIG. 1 also illustrates delivery of oxidant to a reaction chamber for use in ALD—relevant to the generation of an oxidative plasma and its reaction with adsorbed silicon-containing precursor (see step (iii) above). Specifically, gas source 140 ("Manifold C") is shown as a source of O$_2$ and/or N$_2$O gas which is flowed to the showerhead 110 through valve 169 of the PVM 160 shown in the figure. The presence of Manifold C 140 and also "Manifold D" 170 should also be noted in the context of this configuration as they may be used to deliver inert gases for post-dose purge (step (ii) above) and post-RF purge (step (iv) above). With regards to Manifold D 170, the gas delivery system 100 is configured such that purge gas sourced from Manifold D passes through "Preheater" 171 and then is flowed on two paths towards the showerhead. Purge gas flowing on both paths pass through a regulator (172 or 173) and then on through a filter (173B or 175B) flanked upstream and downstream by valves (173A and 173C or 175A and 175C). One path then proceeds directly to showerhead 110, while the other connects to POS 160 first, in order to effectively additionally purge any remaining reactant gases lingering in the POS device after the dosing step. Also, note that, in some embodiments, precursor may be removed from the volume surrounding a processing station within a reaction chamber by applying vacuum to the reaction chamber (e.g., through the operation of a valve-operated vacuum source) without employing the use of an inert purge gas.

In addition, also note that FIG. 1 exhibits a remote plasma source 195, employing a $NF_3$-based plasma (as indicated in the figure), whose fluidic coupling to the reaction chamber and process station is regulated by valve 116. Finally, note that in some embodiments, Manifold B 150 (as regulated by valve 144) may serve as a source of a co-reactant gas—for example, a nitrogen-containing co-reactant such as ammonia—which is flowed to showerhead 110 through valve 165 of POS 160. Co-reactant gases are discussed above and also below with respect to FIGS. 8 and 9.

As described above, a conformal film is typically deposited via ALD by performing multiple ALD cycles in sequence. Due to the fact that each layer deposited by ALD is very thin, typical being formed from a single monolayer of silicon-containing precursor, depositing a film of any substantial thickness typically involves many ALD cycles, and therefore may be relatively time consuming. Thus, it is typically desired that each individual ALD cycle be performed as quickly as reasonably possible—given the chemical kinetics of the reaction sequence, and the limitations of a given reactor setup. Accordingly, a chemical delivery system, such as that schematically illustrated in FIG. 1, is typically required to repeatedly start, stop, and restart delivery of the required precursors, oxidants, etc. in quick succession over the course of multiple ALD cycles, and moreover, to provide stable and consistent flow of the precursors, oxidants, and any other optional reactants when such species are called for. However, in many cases, ALD cycle times are comparable to valve and flow control device operating times, meaning that the time taken for such flow control devices to provide a steady state flow of silicon-containing precursor and/or other reactants becomes the limiting factor preventing desired further reductions in cycle time. These steady flow conditions are important for the consistency of the ALD process, as transient or unstable flow conditions can lead to undesirable variations in the layers deposited via ALD.

One way to circumvent the limitations posed by valve and flow control device operating times is to establish a steady-state flow of reactants by leaving flow control devices in their open positions, and to "divert" the flow of reactants to and from the reaction chamber as required by the timing requirements of an ALD cycle. While the use of a "divert"—where reactants are left flowing from their sources but switched back and forth between "dump" and "wafer cavity" modes—achieves the desired reduction in cycle time, it does so at the expense of wasting valuable silicon-containing precursor and other reactants. In addition, apart from the cost of precursor and/or other reactants, such dumping also places an additional load on a wafer processing system's exhaust/scrubber sub-system.

Accordingly, disclosed herein are several other methods of circumventing the timing limitations of typical valves and flow control devices, methods which reduce the amount of wasted precursor and other reactants relative to the simple flow diversion procedure just described. These methods take advantage of the fact that it is oftentimes desirable to perform ALD in parallel on multiple wafers, and accordingly, multiple processing stations capable of performing ALD are often operated contemporaneously to perform ALD on multiple wafers at the same time. In some embodiments, these multiple processing stations may be present in the same processing chamber—see, e.g., the wafer processing apparatuses described below in reference to FIGS. 6-9 having four processing stations within a single reaction chamber each capable of performing ALD—however, in some embodiments, these multiple processing stations may also be present in separate reaction chambers. In either configuration, methods of performing ALD disclosed herein simultaneously execute ALD cycles on multiple wafers, and operate to conserve silicon-containing precursor and other reactants, by timing and staggering the execution of the various ALD steps (i) through (iv) (see above), so that flow of precursor from a common source can be redirected to and from the different processing stations—at least to the extent allowed by the timing and staggering of steps (i) through (iv)—instead of simply diverting and dumping unneeded flow of precursor and/or other reactants.

Figure 2:
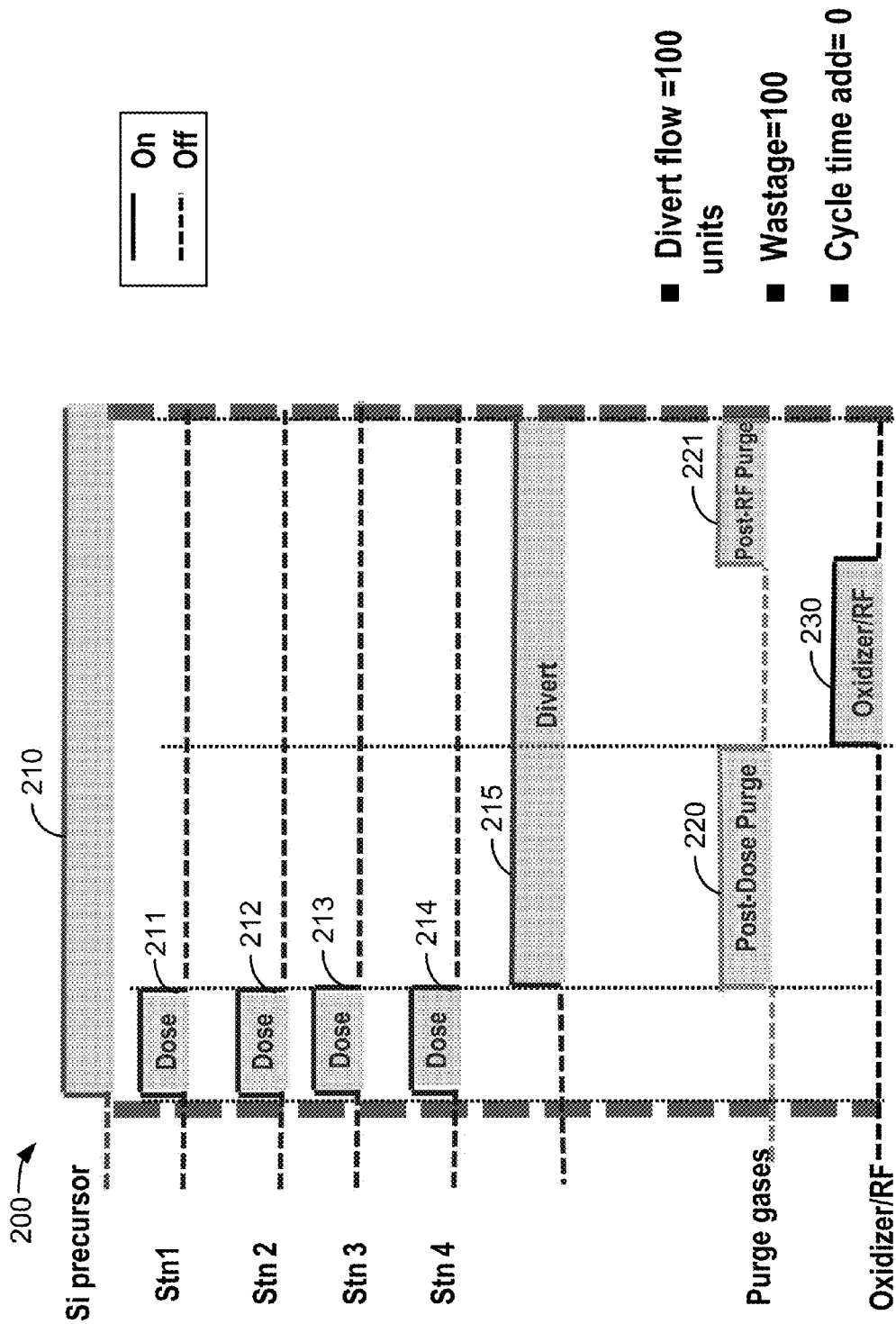
FIG. 2 schematically illustrates a baseline timing diagram corresponding to the typical parallel execution of a sequence of 4 ALD cycles involving the simultaneous dosing of 4 wafer substrates with silicon-containing precursor, each substrate at one of 4 different processing stations.

For example, FIG. 2 schematically illustrates a baseline timing diagram 200 corresponding to the typical parallel execution of a sequence of 4 ALD cycles involving the simultaneous dosing of 4 wafer substrates with silicon-containing precursor, each substrate at one of 4 different processing stations Time moves from left to right in the figure with the vertical broken lines on the far left and far right indicating that the figure represents a single cycle of ALD (for each station) and so that the displayed sequence of steps may be joined end-to-end to represent multiple ALD cycles (at each station). The steps within an ALD cycle referred to as (i), (ii), (iii), and (iv) above correspond to traces labeled in FIG. 2 as 'Dose' 211, 212, 213, 214, 'Post-Dose Purge' 220, 'Oxidizer/RF' 230 (reacting adsorbed precursor with oxidative plasma step), and 'Post-RF Purge' 221 (or 'PosRF' for short in FIG. 5A).

Displayed from top to bottom in the timing diagram is a schematic illustration of silicon-containing precursor delivery to each of 4 processing stations (labeled "Station 1" through "Station 4") which is indicated by 4 traces 211, 212, 213, 214 showing precursor flow directed/redirected to each of the 4 processing stations. Schematically illustrated by a 5th trace 215 is precursor flow diverted to a divert flow path (i.e., not to the processing stations). These 5 traces (211, 212, 213, 214, and 215) represent a breakdown of the total precursor flow schematically illustrated by the top-most trace 210 in FIG. 2. The figure also schematically illustrates the timing of post-dose and post-RF purge gas flow—shown with trace 220/221 labeled "purge gases"—as well as the timing of oxidative plasma generation and reaction with adsorbed precursor—shown with trace 230 labeled "Oxidizer/RF." Among other things, FIG. 2's breakdown of total silicon-containing precursor flow indicates that, in some embodiments, a single gas delivery system like that shown in FIG. 1 may be used to flow precursor to each processing station in, for example, a 4 processing station configuration (possibly all contained within the same reaction chamber). Although it should, of course, also be understood that a more complicated gas delivery system could be used—such as a configuration which provides a dedicated gas delivery system for each processing station.

In the baseline operational sequence schematically illustrated via the timing diagram of FIG. 2, the precursor dosing steps of the 4 ALD cycles are timed to coincide with one another. Thus, in step (i) (far left), substrates positioned at the 4 stations are simultaneously dosed with silicon-containing precursor which is allowed to adsorb onto the surface of each of the 4 wafers. It should be noted that whether a single or multiple gas delivery systems (e.g., one per station) are employed, the collective quantity of gas reactants supplied in the dose step need be sufficient to simultaneously dose all 4 wafers, and so the delivery quantity is typically 4 times that required for the execution of an ALD cycle on a single wafer.

Thus, for purposes of illustrating this operational sequence, the total flow of silicon-containing precursor—represented by trace 210 in FIG. 2 (top left to right)—is said in FIG. 2 to equal 100 units of flow (the units of course being arbitrary for purposes of illustration). The total 100 units of flow (again, shown schematically by the silicon-containing precursor trace 210) are then divided into the 4 doses of 25 flow units each, the doses provided to the 4 wafers at the 4 processing stations concurrently, as illustrated by the 4 dose traces (211, 212, 213, and 214) shown in the figure and corresponding to step (i) above. For context, note that this could correspond to the opening of valve 164 in FIG. 1, while the other valves of the POS remain shut.

However, FIG. 2 also illustrates the extent to which silicon-containing precursor is wasted employing the operational sequence of FIG. 2. In particular, FIG. 2 shows that after dosing step (i) concludes, the totality of precursor flow is diverted as illustrated by the "Divert" trace 215 in the figure, and thus, as stated in the figure, this corresponds to 100 flow units of precursor wastage during the remaining steps (ii), (iii), and (iv) of each ALD cycle. In other words, during the post-dose purge step (ii) (shown by the "Purge gases" trace 220 in FIG. 2), during the reaction of adsorbed precursor via activation with RF-generated oxidative plasma in step (iii) (shown by the "Oxidizer/RF" trace 230 in FIG. 2), and during the post-RF purge (also shown by the "Purge gases" trace 220 in FIG. 2), there is total diversion and wastage of silicon-containing precursor. Thus, FIG. 2 illustrates a baseline operational sequence for comparison with the alternative methodologies described in the context of the figures that follow. To help make these comparisons, the concurrent dosing methodology of FIG. 2 is said to add zero cycle time, but result in 100 units of precursor flow wastage, as stated in the figure.

For context, it should be noted that the transition between the "dose" traces and the "divert" trace could correspond to the closing of valve 164 and the opening of valve 166 of the POS as shown by the "Divert to Vacuum" label of FIG. 1. Likewise, with valves 164 and 166 in these positions (164 closed and 166 opened), the purging steps (ii) and (iv) indicated by the "Purge gases" trace 220 in FIG. 1 may be accomplished by the opening of valve 165, 169 remaining closed of course (and, in some embodiments, also accompanied by the opening of valves 162A and 162B for additional purge in the vicinity of the showerhead). To complete the picture, the reaction via oxidative plasma step (iii) shown by the "Oxidizer/RF" trace 230 in FIG. 2 could correspond to the opening of valve 169 of the POS while the valve 165 (held open for the purge steps) is closed and 164 and 166 remain in their divert positions. It should also be understood that the foregoing description of valve operation in reference to FIG. 1 also applies to the other timing diagrams disclosed herein with the described opening and closing of valves corresponding to the same "Si precursor," "Dose," "Divert," "Purge gases," and "Oxidizer/RF" traces, albeit with their timing altered according to the additional operational sequences and methodologies disclosed in these subsequent figures.

As explained above, a multi-station substrate processing apparatus provides a benefit in that substrates at all stations do not necessarily need to be dosed with reactants at the same time. Thus, disclosed herein are methods of performing ALD simultaneously at multiple processing stations on multiple substrates which operate to conserve silicon-containing precursor and/or other reactants, by timing and staggering the execution of the various ALD steps (i) through (iv), so that a common source of reactant flow may be redirected to and from the different processing stations rather than being diverted as wastage to the extent illustrated by the baseline operational sequence of FIG. 2. These various methodologies are now presented with reference to FIGS. 3 through 5B.

Figure 3:
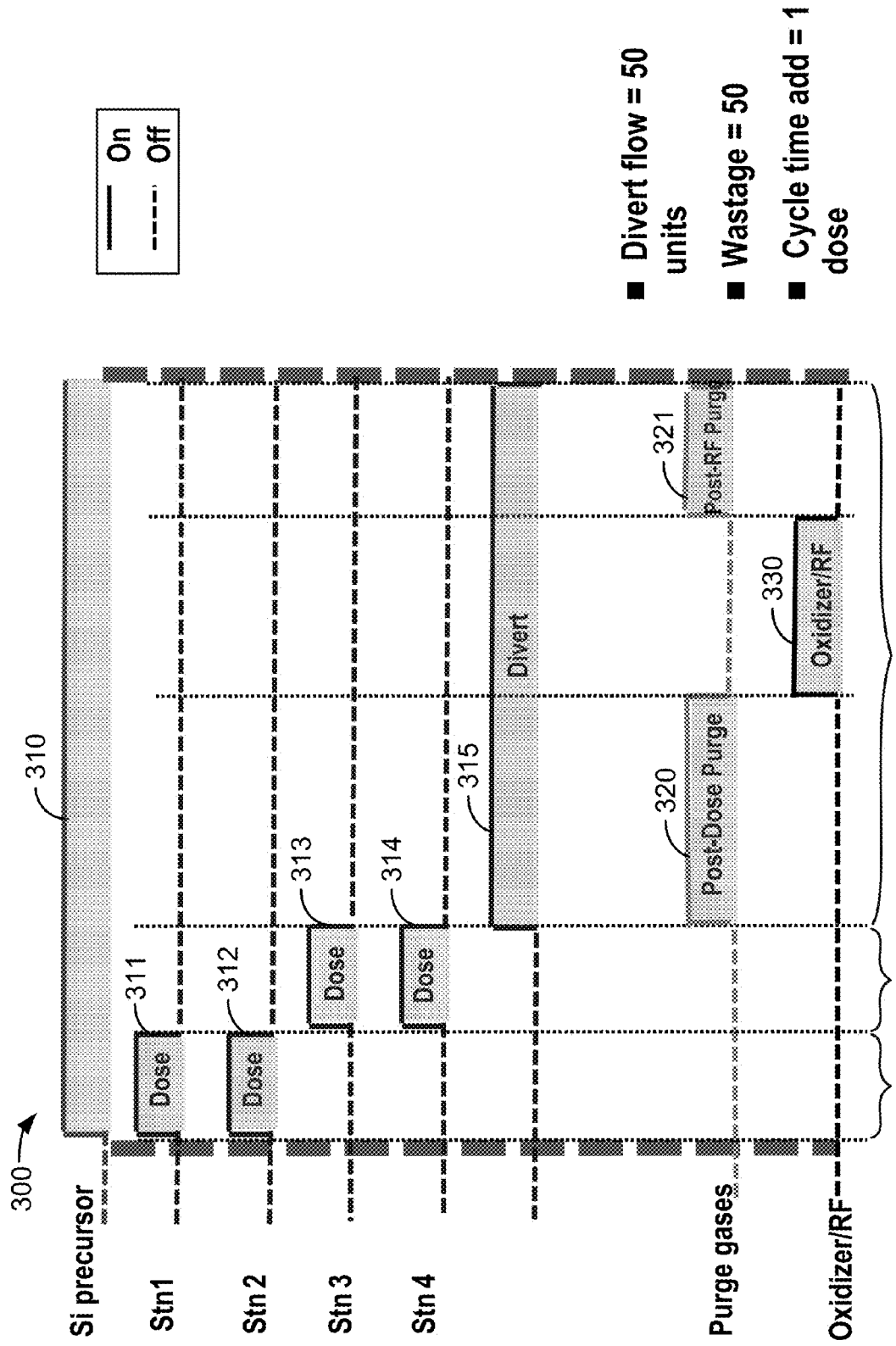
FIG. 3 schematically illustrates a timing diagram corresponding to a parallel execution of a sequence of 4 ALD cycles where the flow of silicon-containing precursor initially doses substrates at processing stations 1 and 2, and afterwards is redirected to dose substrates at stations 3 and 4.

For instance, schematically illustrated in FIG. 3 is a timing diagram 300 corresponding to a parallel execution of a sequence of 4 ALD cycles where the flow of silicon-containing precursor form a common source initially doses wafers at processing stations 1 and 2, and afterwards is redirected to dose wafers at stations 3 and 4. Thus, as shown in the figure, substrate dosing steps (i) of the exhibited ALD cycles involve timing the dosing of the first, second, third, and fourth substrates at processing stations 1, 2, 3, and 4, respectively, in a staggered fashion such that the first and second substrates are dosed during a first dosing phase 351 during which the third and fourth substrates are not substantially dosed, and the third and fourth substrates are dosed during a second dosing phase 352 during which the first and second substrates are not substantially dosed, and wherein the precursor flows continuously from the common source during the first and second dosing phases. Due to the fact that only two wafers are dosed simultaneously, the flow rate of silicon-containing precursor is approximately half of that used in the methodology of FIG. 2 which involved the concurrent dosing of 4 wafers.

Thus, as illustrated and stated in FIG. 3, although the time spent under "divert" is roughly the same as in FIG. 2 (compare the "Divert" traces 315 and 215), the amount of diverted and wasted precursor flow amounts to 50 flow units instead of 100. However, as also stated and shown in FIG. 2, there is an increase in ALD cycle time by the amount of time it takes for the second set of dose steps. Nevertheless, the result is that a stable and continuous flow of precursor is provided to the various stations in a time-controlled manner while reducing the amount of wasted precursor by approximately 50%. Of course, though the examples described here are in the context of a silicon-containing precursor, the same techniques and methodologies for diversion and control of reactant flow in order to minimize waste can also be applied to other reactant species in an analogous manner, as will be appreciated by one on skill in the art. Moreover, one having skill in the art will also appreciate that such staggering could also be done for a two processing station embodiment, wherein dosing first and second substrates are staggered into first and second dosing phases.

Figure 4:
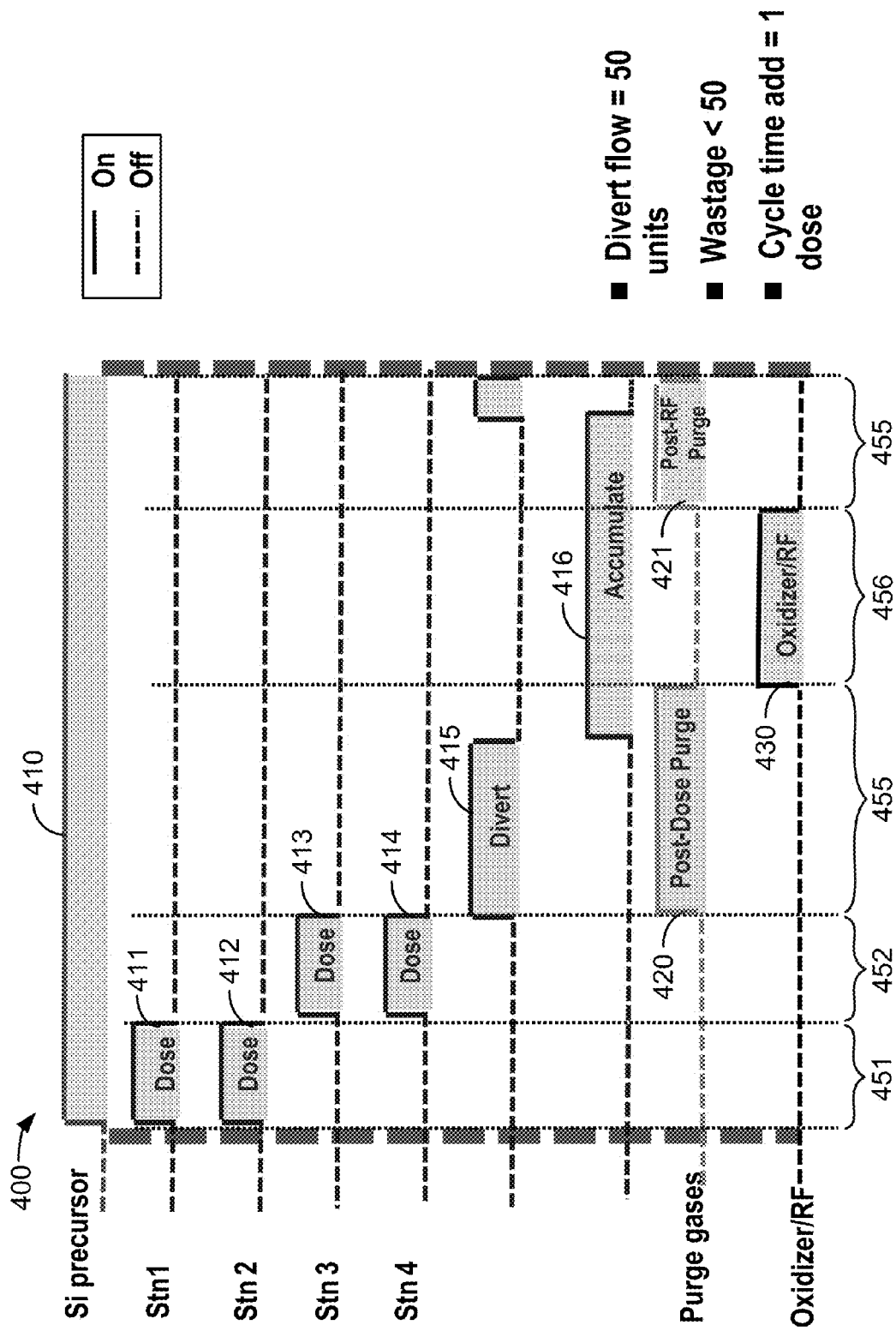
FIG. 4 schematically illustrates a timing diagram similar to that displayed in FIG. 3, but wherein some portion of the divert phase is replaced by an accumulate phase.

FIG. 4 presents a timing diagram 400 which is a variation on the methodology of FIG. 3 wherein the flow pattern of silicon-containing precursor in the two dosing phases of the dosing step (i) is substantially the same as in FIG. 3, but wherein some portion of the divert phase 355 (in FIG. 3), 455 (in FIG. 4) is replaced by an accumulate phase 456. As illustrated by the "Divert" trace 415 and "Accumulate" trace 416 in FIG. 4, after the dose phases, flow of silicon-containing precursor is initially diverted to a precursor-divert flow path (and wasted), but at some point the precursor-divert flow path is blocked (such as by closing valve 166 in FIG. 1) causing precursor to accumulate in a pre-cursor accumulation volume in fluidic-connection with the precursor flow path upstream of the reaction chamber (and, in the embodiment of FIG. 1, upstream of the PVM 160).

The extent to which precursor may be accumulated in some volumetric region of its flow path upstream of the reaction chamber (such as in its flow line or in any other components/devices in line with its flow path upstream of the PVM, for example) depends on several factors such as, for example: the precursor's decomposition temperature; condensation, temperature, and/or pressure restrictions of the components along the precursor's flow path; the feasible flow rates of carrier gas(es) used for vaporization of the precursor; etc.

One of skill in the art will appreciate that increasing the temperature of the precursor and/or of any accompanying carrier gas will increase the concentration of precursor which may remain in the gas phase without condensing. Accordingly, in some embodiments, there may be a heating element in the flow path of the precursor or in the flow path of the carrier gas or both. For example, the Pre-Heater 124 shown in FIG. 1 immediately downstream of Manifold A 130 which is the source of the carrier gas, may be used to increase the temperature of the carrier gas, so that when the carrier gas mixes with the precursor it will have an elevated temperature which may raise the concentration at which the precursor begins to condense. In this manner, a greater quantity of precursor may be accumulated rather than diverted in the accumulation phase shown in FIG. 4.

However, while heating may aid accumulation, there is a point at which an additional increase in temperature will cause degradation of the silicon-containing precursor. Thus, in some embodiments, the maximum temperature is limited by this decomposition temperature. Likewise, the maximum pressure allowed to build up is typically limited to below the pressure point at which condensation begins at a temperature below the aforementioned decomposition temperature. These limitations thus constrain the maximum time for which the precursor and its carrier gas can flow into the "captured" volume without causing condensation related issues. However, it should be understood that these sorts of constraints may be lessened or may not even exist depending on the chemistry of the ALD film being formed. For instance, precursors used for deposition of nitride via ALD may not be subject to such constraints, or at least to a lesser extent.

Minimizing the amount of time precursor is diverted—by interrupting a divert phase with an accumulation phase—reduces the amount of wasted precursor, however, in some embodiments, it is noted that it may be desirable to reinstate the diversion of precursor in another divert phase prior to initiating the next ALD cycle, so that non-steady state flow conditions—potentially caused by pressure build-up during accumulation—do not disrupt the initial "dose" phases of the next ALD cycle. Switching back to "divert" from "accumulate" is illustrated by divert trace 415 and accumulate trace 416 at the far right of the timing diagram in FIG. 4. Relative to FIG. 3, the net result of employing an accumulation phase as shown in FIG. 4 is to reduce precursor wastage to below 50 flow units as stated in the figure. Relative to the method of FIG. 2, the increase in cycle time is still the time it takes for 1 additional does, as was the case in FIG. 3.

Figure 5A:
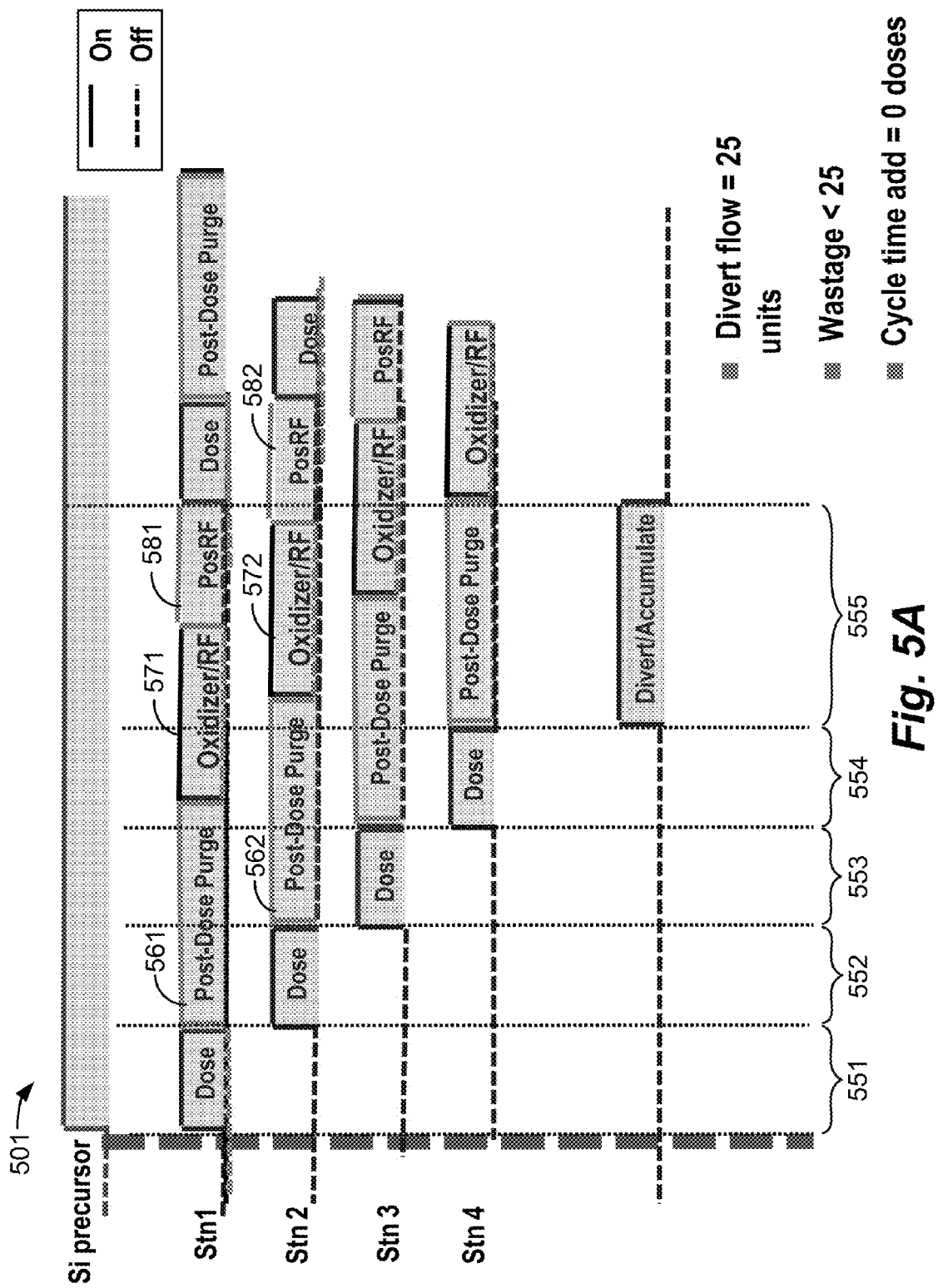
FIG. 5A schematically illustrates a timing diagram providing a sequence of dose timings which fully staggers the dosing of the substrates at stations 1 through 4 such that no two substrates are substantially dosed at the same time.

Another methodology for reducing precursor waste is schematically illustrated by the timing diagram 501 in FIG. 5A which provides an alternative dosing flow pattern relative to that shown in FIGS. 3 and 4. In particular, FIG. 5A provides a sequence of dose timings which fully staggers the dosing of the wafers at stations 1 through 4 such that no two wafers are substantially dosed at the same time, by directing flow of precursor from a common source to the wafer at station 1, redirecting the flow to station 2, then redirecting it to station 3, and finally, redirecting it to station 4.

Thus, as shown in the figure, substrate dosing steps (i) of the displayed ALD cycles involve timing the dosing of the first, second, third, and fourth substrates at processing stations 1, 2, 3, and 4, respectively, in a staggered fashion such that:

the first substrate is dosed during a first dosing phase 551 during which the second, third, and fourth substrates are not substantially dosed;

the second substrate is dosed during a second dosing phase 552 during which the first, third, and fourth substrates are not substantially dosed;

the third substrate is dosed during a third dosing phase 553 during which the first, second, and fourth substrates are not substantially dosed; and the fourth substrate is dosed during a fourth dosing phase 554 during which the first, second, third, and fourth substrates are not substantially dosed.

Precursor may flow continuously from the common source during the first, second, third, and fourth dosing phases, and transitions between the dosing phases may be accomplished by redirecting the continuous flow of precursor to the appropriate processing station based on the dosing phase. Due to the fact that only 1 wafer out of 4 is dosed at a time, precursor flow requirements are reduced to ¼ of the baseline operational sequence presented in FIG. 2 (which involved the concurrent dosing of 4 wafers), or to ½ what was presented in FIGS. 3 and 4 (which involved the concurrent dosing of 2 wafers). As indicted in FIG. 5A, this then reduces the amount of precursor wasted during the divert phase 555 to 25 flow units. In addition, if a portion of the divert phase 555 is replaced with an accumulate phase, the quantity of precursor wasted may be reduced below 25 flow units, as illustrated and stated in FIG. 5A.

Staggering the dosing at all 4 stations could result in an increase in cycle time of 3 dose periods per cycle—e.g., if the remaining steps (ii), (iii), and (iv) of the ALD cycle were timed analogously to the manner these steps are executed in FIGS. 1-4. This still may be a desirable trade-off if cost of precursor is more critical than absolute wafer throughput. However, as shown in FIG. 5A, if the remaining steps of the ALD cycle (ii), (iii), and (iv) are 4-way staggered as well, then over the course of many sequential ALD cycles, on average there will be very little additional cycle time (essentially only an accrual of additional cycle time during the first and final ALD cycles performed). Specifically, as shown in FIG. 5A, to stagger the ALD cycles and to achieve the aforementioned benefit in cycle time, steps (ii), (iii), and (iv) are advanced in time at each processing station—e.g., relative to their timings in FIGS. 3 and 4—such that the sequence of steps (ii), (iii), and (iv) at each processing station are initiated immediately following conclusion of dose step (i) at that processing station—rather than waiting for the dose steps (i) to conclude at the other processing stations as well.

Thus, for example, as shown in FIG. 5A, and focusing on the staggering of steps (i) through (iv) exhibited at stations 1 and 2: during the second dosing phase 552 at station 2, the purge 561 may be underway at station 1, and therefore while the second substrate is dosed in dose step (i) at the second processing station, unadsorbed precursor (and/or reaction by-product) is removed from the volume surrounding the first processing station in ALD step (ii) at the first processing station. Likewise, due to purge 561 at station 1 starting ahead of purge 562 at station 2, purge 561 at station 1 will finish first and Oxidation/RF 571 at station 1 may be started while purge 562 is still ongoing at station 2. Therefore, as shown in the figure, precursor adsorbed on the first substrate may be reacted in ALD step (iii) at the first processing station (e.g., Oxidation/RF 571) while unadsorbed precursor (and/or reaction by-product) is removed in ALD step (ii) from the volume surrounding the second processing station (e.g., post-dose purge 562). To continue the sequence, as shown in the figure, desorbed precursor may be removed in ALD step (iv) from the volume surrounding the first processing station (e.g., in post-RF purge 581) while precursor adsorbed on the second substrate is reacted in ALD step (iii) at the second processing station (e.g., in Oxidizer/RF 572).

Of course, one of ordinary skill in the art will appreciate based on the foregoing disclosure that the aforementioned staggering of ALD steps (i) through (iv) may be implemented in the context of multi-station ALD methodologies and apparatus having 2, or 3, or 4, or 5, or 6, or 7, or 8, etc. processing stations (or having a number of processing stations within a range such as, for example, 2 to 4 processing stations, or 2 to 6 processing stations, or 2 to 8 processing stations, or 4 to 6 processing stations, or 4 to 8 processing stations, or 6 to 8 processing stations).

However, it should also be noted with respect to this embodiment (as well as with respect to the embodiment illustrated in FIG. 5B below), that it may be important to avoid mixing of the oxidizer and precursor in gaseous form because, depending on the specific chemistries involved, such mixing may induce a gas-phase CVD-like reaction between oxidant and precursor causing contamination of the reaction chamber and potentially the feed lines and showerhead leading to the chamber. Within a multi-station reaction chamber (such as the 4 station chamber described below), curtains of (inert) gas may be used to separate the processing occurring at each station and thus prevent such undesired mixing within the reaction chamber. Judicious use of the feed lines and valving which supply oxidant and precursor to the reaction chamber may also be used to prevent such mixing upstream of the reaction chamber. However, it should also be understood that for certain chemistries, such mixing may not pose a problem.

Figure 5B:
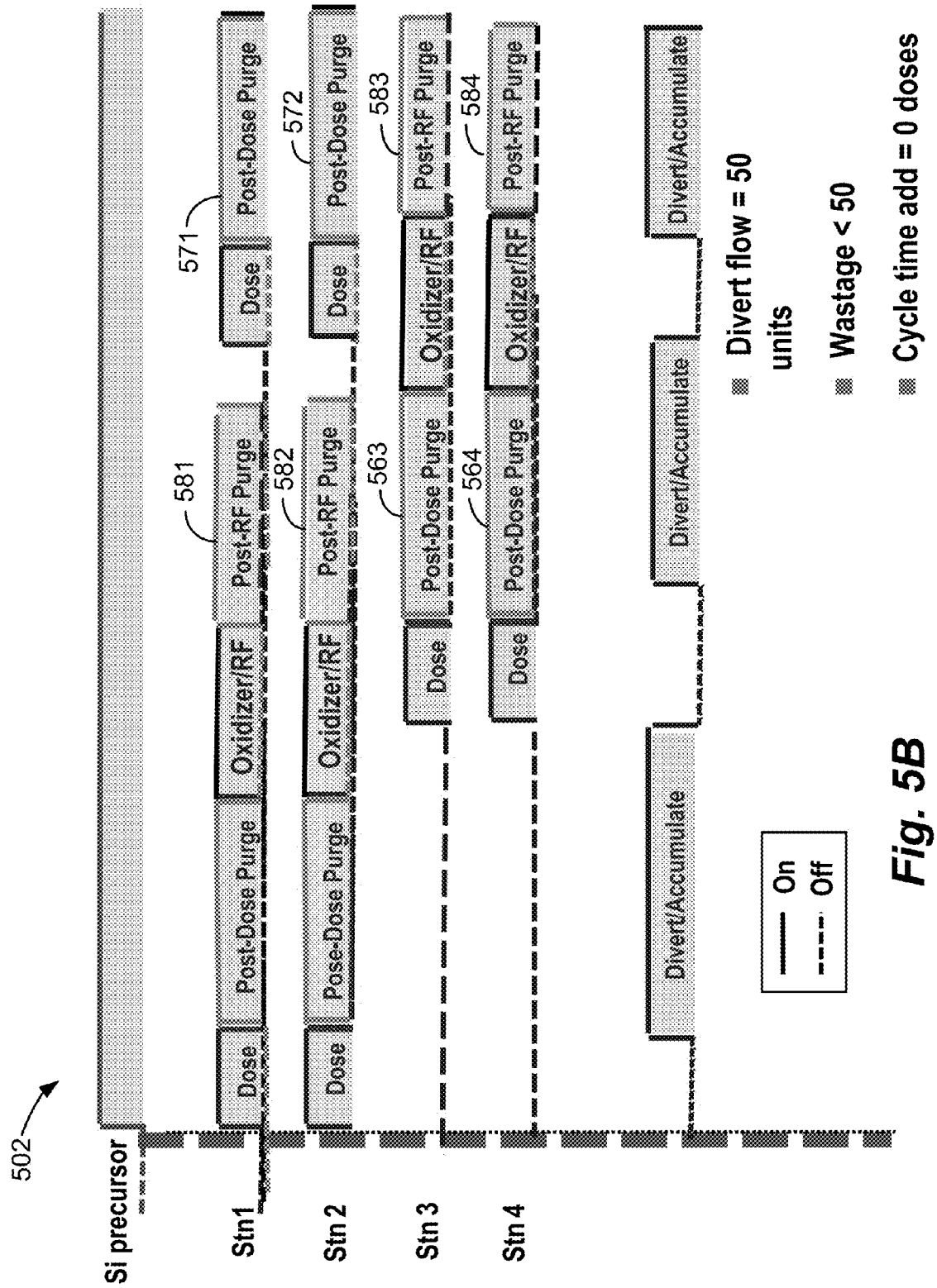
FIG. 5B schematically illustrates a timing diagram staggering substrate dosing into two phases such that the post-RF purge step at stations 1 and 2 coincides with the post-dose purge steps at stations 3 and 4, and likewise, on the next cycle, the post-dose purge at stations 1 and 2 coincides with the post-RF purge at stations 3 and 4.

Yet another methodology is illustrated by the timing diagram 502 in FIG. 5B, which is somewhat of a hybrid between the flow pattern of FIGS. 3-4 and that of FIG. 5A. FIG. 5B presents a flow pattern where the dosing is staggered into two phases—resulting in a 50% reduction in flow rate versus the baseline of FIG. 2—but instead of initiating dosing of the second pair of processing stations (e.g., stations 3 and 4) immediately after dosing the first pair (e.g., stations 1 and 2) concludes, flow is diverted and/or accumulated for a certain period of time. This is done so that the timing of the dosing of the second pair of stations (e.g., stations 3 and 4) may be chosen so as to synchronize the post-dose and post-RF purge steps (ALD steps (ii) and (iv)). As shown in the FIG. 5B, if the timing is chosen properly, the post-RF purge at stations 1 and 2 (581 and 582, respectively) may be made to coincide with the post-dose purge at stations 3 and 4 (563 and 564, respectively), and likewise, on the next cycle, the post-dose purge at stations 1 and 2 (571 and 572, respectively) may be made to coincide with the post-RF purge at stations 3 and 4 (583 and 584, respectively).

As a result of the staggered flow pattern exhibited in FIG. 5B, it is evident that in some embodiments, desorbed precursor is removed in an ALD step (iv) from the volume(s) surrounding certain processing station(s) while unadsorbed precursor (and/or reaction by-product) is removed in an ALD step (ii) from the volume(s) surrounding other processing station(s), and conversely, desorbed precursor is removed in an ALD step (iv) from the volume(s) surrounding these latter processing station(s) while unadsorbed precursor (and/or reaction by-product) is removed in ALD step (ii) from the volume(s) surrounding the former processing station(s). This may provide operational advantages in terms of the purge functionality, duration, and effectiveness. For example, since in some embodiments (such as that described and illustrated below with respect to FIGS. 6-9) 4 processing stations may be present in the same reaction chamber, a concurrent purge may allow for the entire chamber to be swept free of reactants and byproducts, promoting the efficiency of the purge in comparison to only purging selected stations within a processing chamber at any one time. Of course, it should be appreciated that although FIG. 5B illustrates this staggered flow pattern in the context of 4 processing stations, it may also be implemented in the context of just 2 processing stations, by matching up the desorbed precursor removal in an ALD step (iv) at a first processing station with the unadsorbed precursor (and/or reaction by-product) removal in an ALD step (ii) at a second processing station. Such a staggering scheme may also be implemented in the context of more than 4 processing stations.

The ALD methodologies and timing sequences described above may be advantageous due to the lower flow rates during the dose phases, as described above. In some embodiments, this may provide:

1. Better performance of liquid/vapor precursor delivery systems due to lower quantity needed
2. Use of otherwise challenging liquid delivery methods and chemistries on a multi-station/batch reactor/processing chamber: e.g., a solid precursor with very low flow rate; e.g., a liquid that can be delivered as a vapor instead of as a direct liquid injection Based on the foregoing, it should be appreciated that lower precursor wastage may also be achieved through starting and stopping precursor flow, however for the reasons explained above, modern flow control devices for vapor and liquid precursors do not typically behave well in this operational mode, and the resulting precursor flows usual exhibit significant undesirable transient flow characteristics. In contrast, redirecting a continuous precursor flow to various processing stations (as described herein) may greatly reduce undesirable transient flow characteristics, because while precursor flow to the various processing stations may be sharply controlled, precursor flow in the frame of reference of the flow control devices is steady and constant.

Apparatuses

The methods described herein may be performed with respect to any suitable multi-station substrate/wafer processing apparatus. A suitable apparatus may include hardware for accomplishing the process operations and a system controller having machine-readable instructions for controlling process operations in accordance with the present disclosure.

Thus, in some embodiments, an apparatus suitable for depositing layers of dielectric material on multiple semiconductor substrates may include a plurality of processing stations each having a substrate holder contained within one or more reaction chambers, a gas delivery system (such as that exhibited in FIG. 1) including a valve assembly for directing flow of dielectric film precursor to each of the processing stations and to a precursor-divert flow path (such as operated by valve 166 in FIG. 1), and in some embodiments also a valve-operated vacuum source for removing precursor from the volumes surrounding the processing stations inside the one or more reaction chambers. A controller associated with such an apparatus may therefore include machine-readable instructions for operating the valve assembly and vacuum source. In some embodiments, said instructions may include instructions for operations embodying ALD operations (i) though (iv) as described above, and instructions for repeating ALD operations (i) through (iv) multiple times to form multiple layers of dielectric material on the multiple substrates at the multiple processing stations of the substrate processing apparatus.

The system controller will typically include one or more memory devices and one or more processors configured to execute instructions for controlling process operations so that the apparatus will perform a method in accordance with the present disclosure. For example, in some embodiments, the system controller may operate various gas delivery lines, valves, valve assemblies, manifolds, temperature controllers, plasma controllers, RF power sources/generators, pressure controllers, valve-operated vacuum sources, etc. to adjust process conditions within the substrate processing apparatus. In some embodiments, machine-readable media having stored thereon the machine-readable instructions for controlling process operations in accordance with the present disclosure may be coupled to the system controller or may comprise the system controller.

Figure 6:
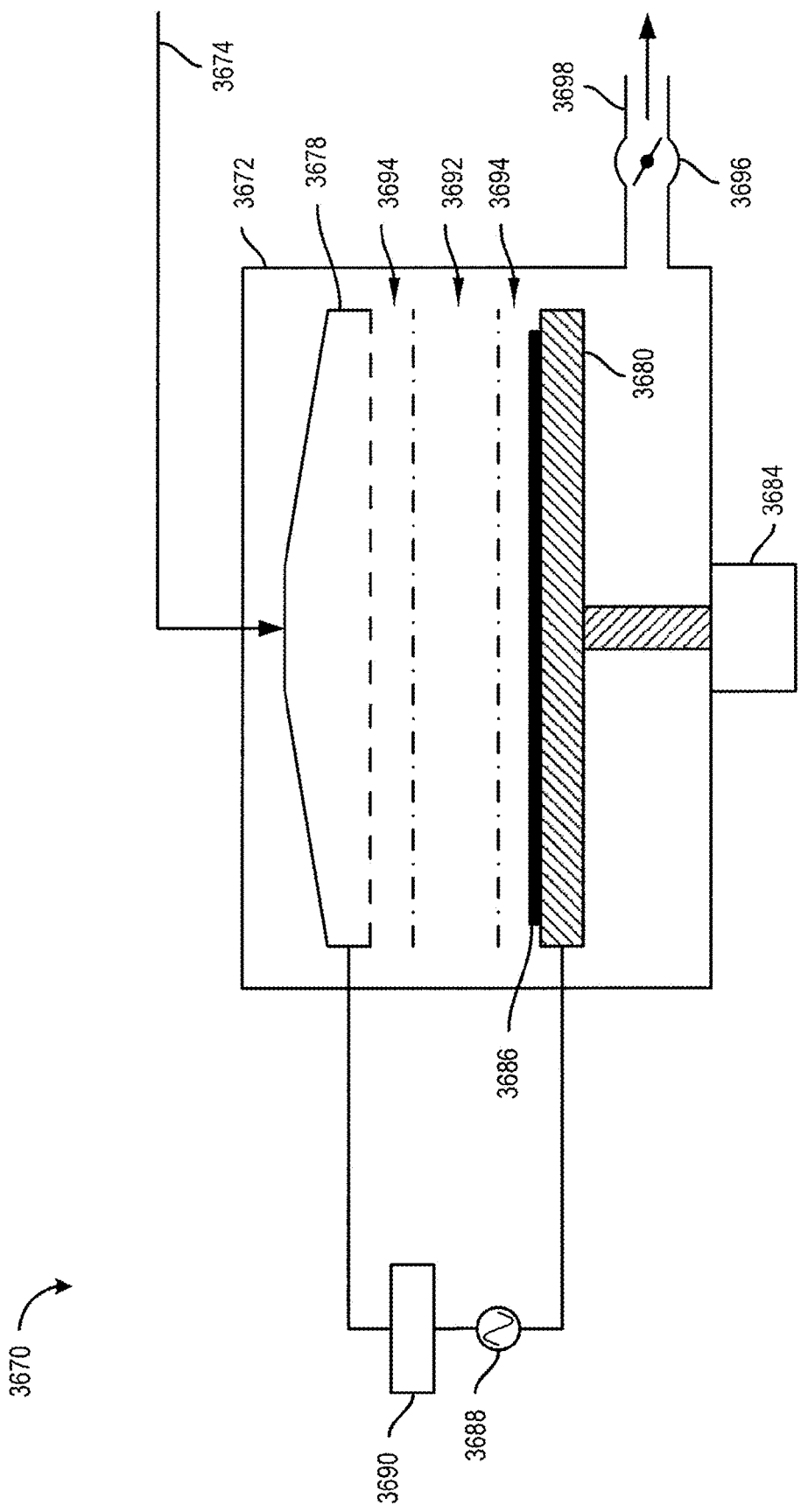
FIG. 6 schematically illustrates an embodiment of a substrate processing station depicted as a single processing station located within a single reaction chamber.

For example, FIG. 6 schematically illustrates an embodiment of a processing station 3600. For simplicity, processing station 3600 is depicted as a standalone processing station having a reaction chamber 3672 for maintaining a low-pressure environment. However, it will be appreciated that a plurality of processing stations 3600 may be included in a common low-pressure process tool environment—e.g., within a common reaction chamber. Processing station 3600 includes a process gas delivery line 3674 for providing process gases, such as inert purge gases, precursors such as silicon-containing dielectric film precursors, other reactants, and treatment reactants, for delivery to processing station 3600. In the example shown in FIG. 6, a showerhead 3678 is included to distribute process gases within processing station 3600. Substrate/wafer 3686 is located beneath showerhead 3678, and is shown resting on a substrate holder 3680 supported by a pedestal 3682. In some embodiments, pedestal 3682 may be configured to rotate about a vertical axis. Additionally or alternatively, pedestal 3682 may be configured to translate horizontally and/or vertically.

Figure 7:
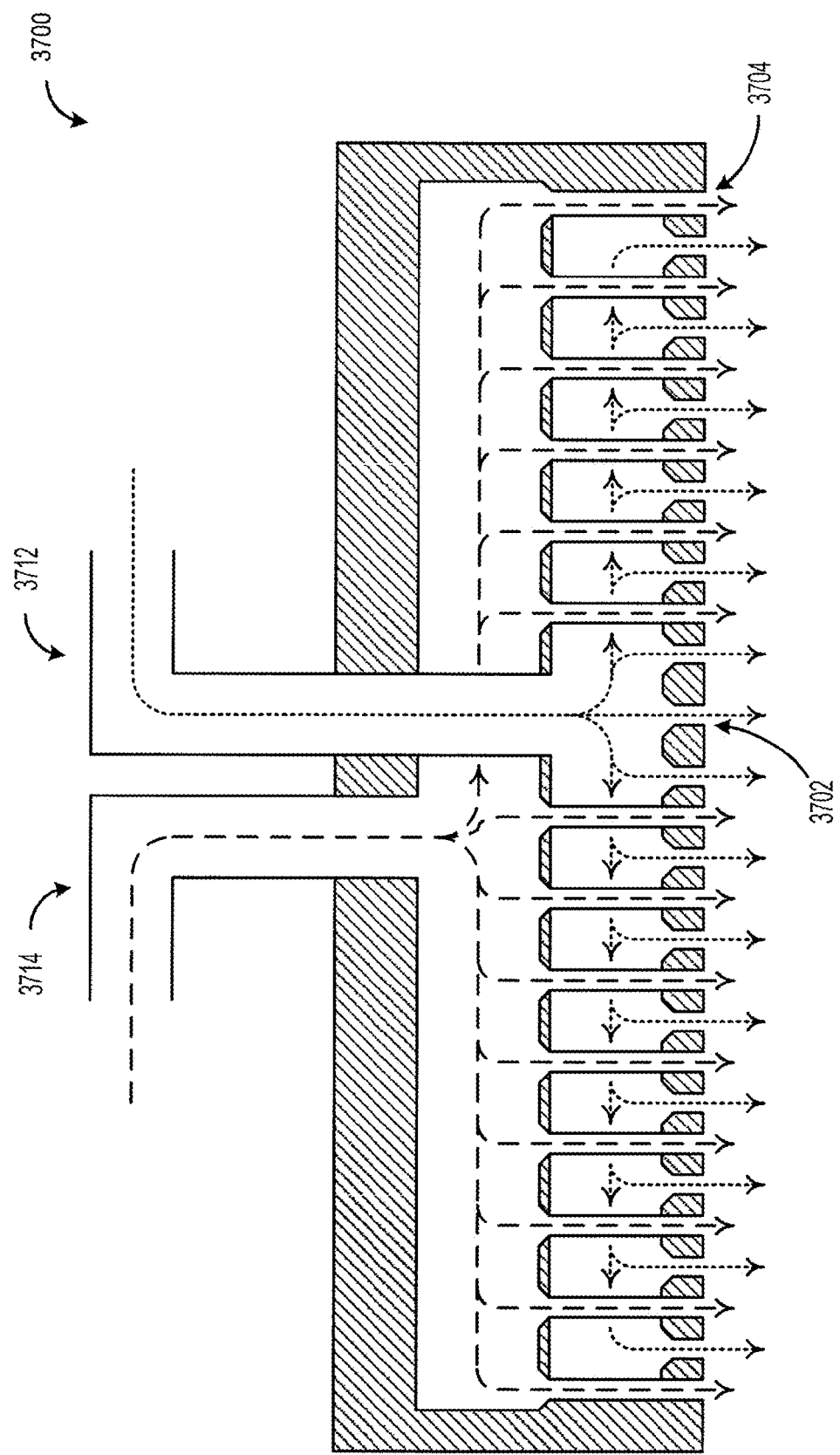
FIG. 7 schematically illustrates an embodiment of a dual-plenum showerhead.

In some embodiments, showerhead 3678 may be a single-plenum, dual-plenum, or multi-plenum showerhead. For example, FIG. 7 schematically shows an embodiment of a dual-plenum showerhead 3700. A first set of holes 3702 receives gas from a first process gas delivery line 3712 and a second set of holes 3704 receives gas from a second process gas delivery line 3714. Such physical isolation of process gases may provide an approach to reducing small particle generation from reaction between incompatible process gases in process gas delivery plumbing upstream of showerhead 3700. Any suitable segregation scheme may be employed. For example, in one scenario, holes 3702 may be dedicated to a silicon dioxide film deposition process while holes 3704 may be dedicated to a silicon nitride film deposition process. In another scenario, holes 3704 may be dedicated to oxidizing reactants while holes 3704 may be dedicated to reducing reactants. While the example shown in FIG. 6 is a dual-plenum showerhead, it will be appreciated that, in some embodiments, a showerhead may be a multi-plenum showerhead having three or more sets of holes.

Showerhead 3678 and holder 3680 electrically communicate with RF power source 3688 and matching network 3690 for powering a plasma 3692 (such as an oxidative plasma) within reaction chamber 3672. Plasma 3692 may be contained by a plasma sheath 3694 located adjacent to showerhead 3678 and holder 3680. While FIG. 6 depicts a capacitively-coupled plasma, plasma 3692 may be generated by any suitable plasma source. In one non-limiting example, plasma 3692 may include a parallel plate plasma source. Furthermore, while RF power source 3688 and matching network 3690 may be used to generate a plasma within the reaction chamber which contains the one or more substrate processing stations, in other embodiments, said oxidative plasma may be generated remotely from, and thereafter introduced into, said reaction chamber. For instance, FIG. 1 schematically illustrates a remote plasma source 195 regulated by valve 116.

In the embodiment shown in FIG. 6, RF power source and generator 3688 may provide RF power of any suitable frequency. In some embodiments, RF power source and generator 3688 may be configured to independently generate and control high- and low-frequency RF power. Examples of low-frequency RF power produced by an RF power source and generator may include, but are not limited to, frequencies between 200 kHz and 2000 kHz. Example high-frequency RF power may include, but are not limited to, frequencies between 13.56 MHz and 80 MHz. Likewise, RF power source and generator 3688 and matching network 3690 may be operated at any suitable power to form plasma 3692. Examples of suitable powers include, but are not limited to, powers between 250 W and 5000 W for a high-frequency plasma and powers between 0 W and 2500 W for a low-frequency plasma for a four-processing station multi-substrate processing tool including four 15-inch showerheads. RF power source and generator 3688 may be operated at any suitable duty cycle. Examples of suitable duty cycles include, but are not limited to, duty cycles of between 5% and 90%.

Returning to FIG. 6, in some embodiments, holder 3680 may be temperature controlled via heater 3684. Further, in some embodiments, pressure control for processing station 3600 may be provided by a valve-operated vacuum source such as butterfly valve 3696 which, as shown in FIG. 6, throttles a vacuum provided by a vacuum pump (not shown) fluidly coupled to processing station exhaust line 3698. However, in some embodiments, pressure control of processing station 3600 may also be adjusted by varying a flow rate of one or more gases introduced to processing station 3600. It will be appreciated that control of one or more process parameters may be provided locally (e.g., RF power may be controlled by a plasma controller communicating with RF power supply 3688, processing station pressure may be controlled by a valve controller communicating with butterfly valve 3696 or with gas metering valves or flow controllers coupled with process gas delivery line 3674, etc.) or under partial or total control provided by a system controller (described above and below) communicating with processing station 3600 without departing from the scope of the present disclosure.

In some embodiments of a multi-station substrate processing apparatus, control and/or supply of various process inputs (e.g., process gases, plasma power, gases for plasma generation, reactants, film precursors, heater power, etc.) may be distributed from shared sources to the plurality of processing stations within the multi-station apparatus. For example, in some embodiments, a shared source of RF power may supply RF power for plasma generation within two or more processing stations. In another example, a shared gas distribution manifold may supply process gases to two or more processing stations. Some non-limiting example embodiments of multi-station processing tools are described below.

Figure 8:
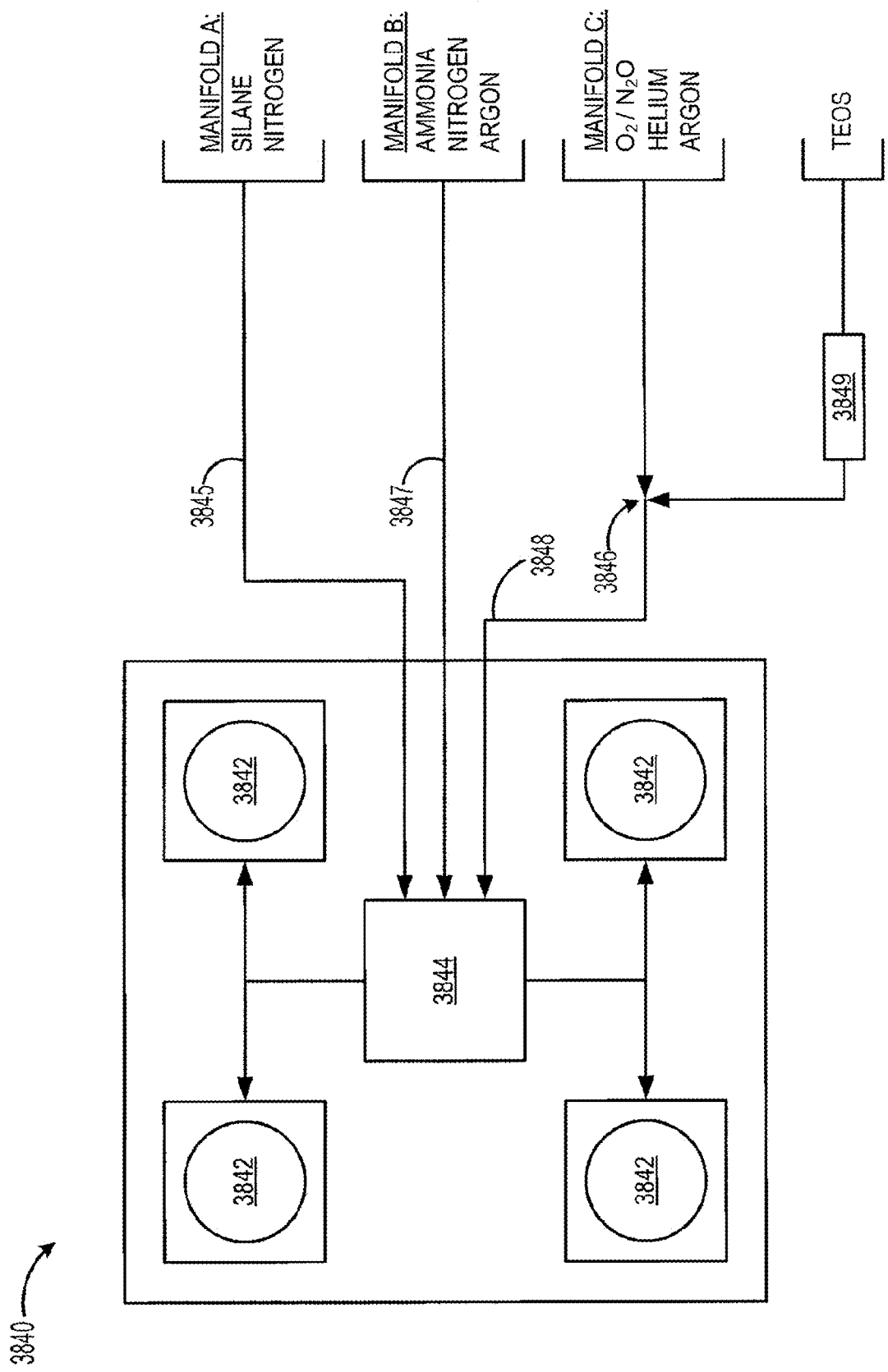
FIG. 8 schematically illustrates an embodiment of a multi-station substrate processing apparatus which includes a plurality of processing stations in a common low-pressure reaction chamber.

FIG. 8 schematically shows an example substrate processing apparatus 3840, which includes a plurality of processing stations 3842 in a common low-pressure reaction chamber. By maintaining each station in a low-pressure environment, defects caused by vacuum breaks between film deposition processes may be avoided. In the example shown in FIG. 8, each processing station 3842 is configured to deposit a film stack comprising multiple layers of TEOS (tetraethyl orthosilicate, $Si(OC_2H_5)_4$)-based silicon dioxide film and silane ($SiH_4$)-based silicon nitride film. In certain such embodiments, such a film stack may comprise alternating layers of silicon dioxide film and silicon nitride film, one deposited atop the other. In the embodiment depicted in FIG. 8, process gases for each processing station 3842 are supplied by a common mixing vessel 3844 for blending and/or conditioning process gases prior to delivery. In some embodiments, mixing vessel 3844 may be temperature controlled. Process gases, including film precursors (such as silicon-containing film precursor) and possibly other reactants in a carrier gas, as well as gases for plasma support, may be supplied from a plurality of process gas delivery lines, valves, and manifolds. For example, FIG. 8 depicts a manifold A including silane and nitrogen (as the carrier gas) fluidly communicating with a silane delivery line 3845; a manifold B including ammonia and nitrogen (again, serving as a carrier gas) fluidly communicating with an ammonia delivery line 3847; and a manifold C including oxygen gas ($O_2$) and/or nitrous oxide ($N_2O$), helium, and/or argon (the latter two as carrier gases) fluidly communicating with a TEOS delivery line 3848. Note that other carrier gas configurations are feasible as well, such as, in one non-limiting example, helium and/or argon are provided to each of manifolds A, B, and C. In the example shown in FIG. 8, TEOS is introduced into TEOS delivery line 3848 fluidly communicating with manifold C at mixing point 3846. In some embodiments, liquid TEOS may be vaporized by optional vaporizer 3849 upstream of mixing point 3846. It should be appreciated that other suitable arrangements and chemistries (as described above) are included within the scope of the present disclosure, and that various ALD-based film deposition chemistries and multi-substrate apparatuses and arrangements may benefit from the process timing sequences disclosed herein.

Deposition of each film type may occur by a process that may include one or more of the above-described phases suitably modified for in-situ deposition of TEOS-based silicon dioxide films and silane-based silicon nitride films. Because each processing station 3842 is configured to provide each film type, additional purge and/or evacuation steps may be included within one or both processes to separate incompatible process gases. For example, in one scenario, residual oxygen adsorbed to plumbing surfaces may react with subsequently introduced silane to form fine silicon dioxide particulates. In another scenario, residual TEOS may react with subsequently introduced ammonia to form silicon oxynitride particulates. These particulates may be entrained during a gas flow event and may be distributed on the substrate surface as particle defects. As described above, one approach to addressing generation of such particles is by using one or more purge and/or evacuation cycles to displace incompatible process gases from surfaces and/or spaces shared by the process gases during transitions between deposition phases. In some embodiments, such a prior reactant/precursor elimination step may be accelerated by pumping the processing chamber to a base pressure—such as specifically described in detail above with respect to the reference pump-to-base (PTB) process. However, in other embodiments, a continuous plasma on (CPO) process, such as that described in detail above, may be employed as an alternative to a PTB-type process.

Figure 9:
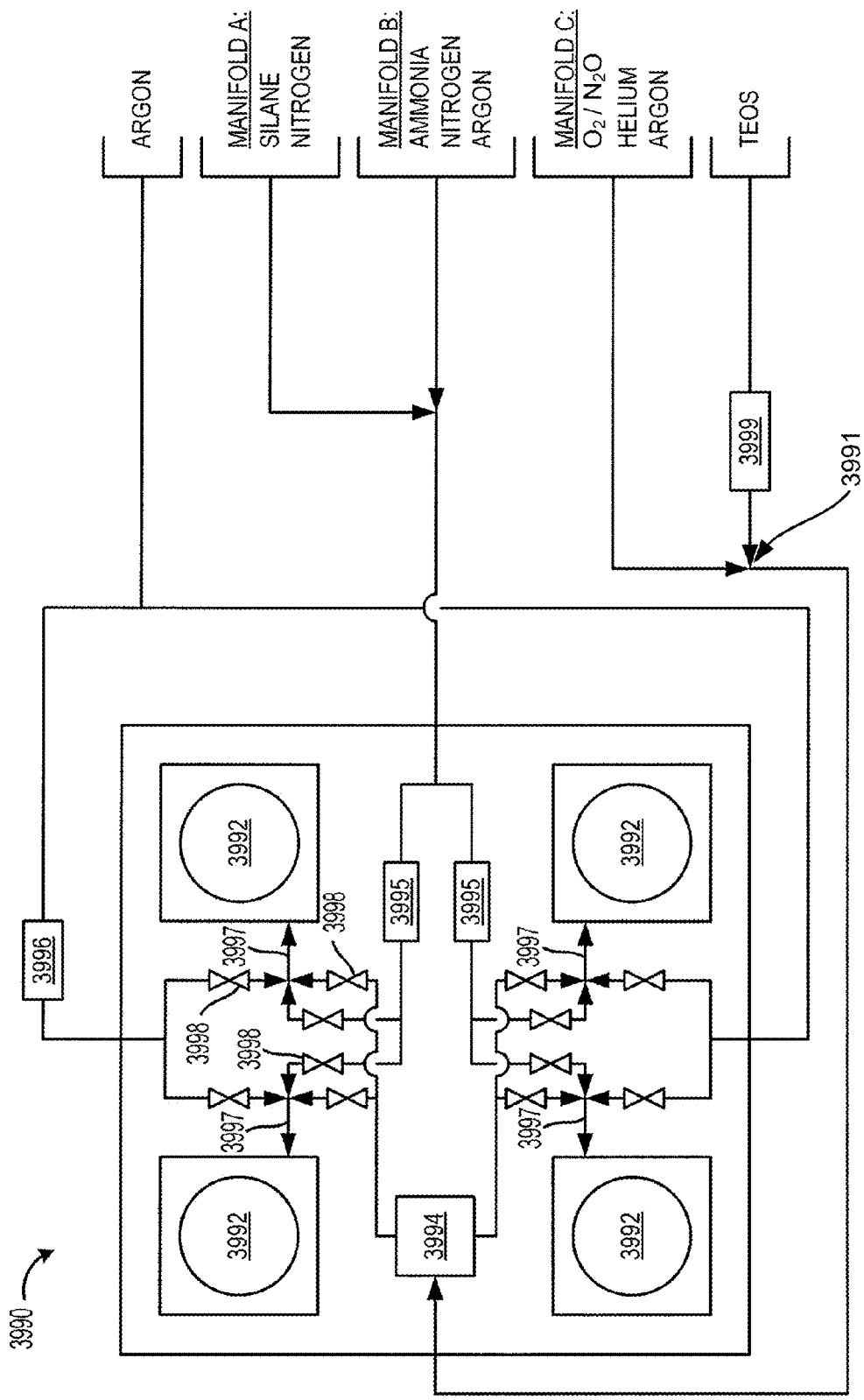
FIG. 9 schematically illustrates an embodiment of a multi-station substrate processing apparatus which includes a plurality of processing stations in a common low-pressure reaction chamber similar to that schematically illustrated in FIG. 8, but additionally employing various mixing vessels for various reactants as well as additional feed line valving.

In some embodiments, separate mixing vessels may be employed, separating incompatible reactants and precursors and potentially reducing PTB, purge, and CPO times. For example, FIG. 9 schematically shows an example substrate processing apparatus 3990, which includes a plurality of processing stations 3992 in a common low-pressure reaction chamber similar to that schematically illustrated in FIG. 8.

In this example, processing stations 3992 are configured to deposit a film stack comprising multiple layers of TEOS-based silicon dioxide films and silane-based silicon nitride films. In certain such embodiments, such a film stack may comprise alternating layers of silicon dioxide film and silicon nitride film, one deposited atop the other. Process gases may be supplied to the processing stations 3992 from a plurality of process gas manifolds, each of which may include any suitable process gas. For example, FIG. 9 depicts a manifold A including silane and nitrogen (as a carrier gas) fluidly communicating with processing stations 3992; a manifold B including ammonia and nitrogen (as a carrier gas) fluidly communicating with processing stations 3992; and a manifold C including oxygen gas ($O_2$) and/or nitrous oxide ($N_2O$), helium, and argon fluidly communicating with processing stations 3992. However, it will be appreciated that other suitable arrangements are included within the scope of the present disclosure. In one non-limiting example, helium and/or argon are provided to each of manifolds A, B, and C. Oxide film reactants, shown in FIG. 9 as TEOS and oxygen, are delivered to each processing station 3992 via an oxide system mixing vessel 3994. In the example shown in FIG. 9, liquid TEOS may be vaporized by optional vaporizer 3999 and mixed with oxygen gas ($O_2$) and/or nitrous oxide ($N_2O$) supplied from manifold C at mixing point 3991. Nitride film reactants, shown in FIG. 9 as silane and ammonia, are supplied via manifolds A and B, respectively, to each processing station 3992 via nitride system mixers 3995. In some embodiments, nitride system mixers 3995 may include dynamic or static mixing elements. In one non-limiting example, nitride system mixers 3995 may be static gas mixers including static, helically-shaped baffles. Additionally or alternatively, in some embodiments, nitride system mixers 3995 may include one or more heated mixing vessels. While FIG. 9 shows that process tool 3990 comprises two nitride system mixers 3995 for mixing nitride film reactants, it will be appreciated that any suitable number of nitride system mixers 3995 may be employed within the scope of the present disclosure. In some examples, three or more nitride system mixers may be used; in some other examples, a single nitride system mixer 3995 may be used, or the nitride system mixer 3995 may be omitted. In some embodiments, one or more nitride system mixers 3995 may include a mixing vessel. For example, in one scenario, one or more mixing vessels having no baffles may be substituted for one or more nitride system mixers 3995. In some embodiments, inert gases, such as argon, helium, and nitrogen, may be supplied to one or more processing stations, providing purging, process gas dilution, and pressure control capability, as well as serving as a medium for plasma generation within the processing chamber. In some embodiments, argon is supplied through inert mixer 3996 to the processing chamber for use in generating an argon-based plasma. In certain such embodiments, the argon-based plasma may be used to accelerate elimination of contaminating species from the processing chamber, such as film precursors leftover from a previous film deposition step. In the example shown in FIG. 9, argon is provided to each processing station 3992 via two inert mixers 3996. However, it will be appreciated that, in some embodiments, any suitable number of inert mixers 3996 may be employed, or in the alternative, that inert mixers 3996 may be omitted. In some embodiments, as illustrated in FIG. 9, a plurality of valves 3998 for each processing station 3992 isolate upstream portions of the oxide film gas delivery plumbing from the nitride film gas delivery plumbing from one another and from a processing station feed 3997. This may prevent reactions between incompatible reactants. In some embodiments, the arrangement of valves 3998 may comparatively reduce a volume of processing station feed 3997, further reducing potential reactions between incompatible reactants. While FIG. 9 depicts three valves 3998 and a single processing station feed 3997 serving each processing station 3992, it will be appreciated that any suitable number of valves 3998 and processing station feeds 3997 may be employed. For example, in some embodiments, each process gas may have a separate processing station feed 3997 serving each processing station 3992.

Finally, it should be noted that while FIGS. 7 and 8 depict multi-station substrate processing apparatuses having 4 processing stations within a single reaction chamber, other configurations may have a greater or lesser number of processing stations within a single reaction chamber. Thus, for example, in some embodiments, a multi-station substrate processing apparatus may have 2, 3, 4, 5, 6, 7, 8, 9, 10, 11, 12, 13, 14, 15, or 16, or more processing stations per reaction chamber; or a number of processing stations per reaction chamber within a range defined by any pair of the foregoing numbers of processing stations per reaction chamber: e.g., 2 to 6 processing stations per reaction chamber, 4 to 8 processing stations per reaction chamber, 8 to 16 processing stations per reaction chamber, etc.

However, in other embodiments, a multi-station substrate processing apparatus may have just a single processing station per reaction chamber—e.g., as in FIG. 6 above—and the staggering of precursor dosing may be accomplished by redirecting precursor between multiple processing stations each of which is located within a different reaction chamber. It should therefore be noted that the embodiments above (methods and apparatuses) have been described in terms of "processing stations"—the location where an individual substrate is dosed with precursor—in order to encompass the possibilities that multiple processing stations may be located within the same or different reaction chambers. Thus, for example, while the disclosed methods may be performed with respect to a single reaction chamber having 2, or 4, or 6, etc. processing stations, they may also be performed with respect to 2, or 4, or 6, etc. reaction chambers each having a single processing station. (For instance, in some embodiments, a first processing station may be located within a first reaction chamber, and a second processing station may be located within a second reaction chamber.) Of course, a combination of these two cases is also possible—e.g., precursor redirect operations may be performed with respect to 4 processing stations where 2 processing stations are contained within each of 2 reaction chambers.

Photolithography

The apparatus/process described herein above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Other Embodiments

Although the foregoing disclosed processes, methods, systems, apparatuses, and compositions have been described in detail within the context of specific embodiments for the purpose of promoting clarity and understanding, it will be apparent to one of ordinary skill in the art that there are many alternative ways of implementing these processes, methods, systems, apparatuses, and compositions which are within the spirit of this disclosure. Accordingly, the embodiments described herein are to be viewed as illustrative of the disclosed inventive concepts rather than restrictively, and are not to be used as an impermissible basis for unduly limiting the scope of any claims eventually directed to the subject matter of this disclosure.

The invention claimed is:

1. A method of depositing layers of material on multiple semiconductor substrates in multiple reaction chambers, the method comprising:
   (i) dosing the substrates in the reaction chambers with a film precursor by introducing the precursor into the reaction chambers and allowing the precursor to adsorb onto the surface of the substrates in an adsorption-limited manner;
   (ii) removing unadsorbed precursor from the reaction chambers;
   (iii) reacting adsorbed precursor with a plasma, after removing unadsorbed precursor, to form a layer of material on the substrates;
   (iv) removing desorbed precursor and/or reaction by-product from the reaction chambers when present after reacting adsorbed precursor; and
   (v) repeating (i) through (iv) multiple times to form multiple layers of material on the multiple substrates in the reaction chambers;
   wherein the dosing in (i) comprises dosing a first substrate in a first reaction chamber and a second substrate in a second reaction chamber with precursor flowing from a common source, the timing of said dosing in (i) staggered such that:
      the first substrate is dosed during a first dosing phase during which the second substrate is not substantially dosed; and
      the second substrate is dosed during a second dosing phase during which the first substrate is not substantially dosed; and
   wherein the precursor flows continuously from the common source during the first and second dosing phases.

2. The method of claim 1, wherein the first dosing phase transitions to the second dosing phase by redirecting the continuous flow of precursor from the first reaction chamber to the second reaction chamber.

3. The method of claim 2, wherein the redirecting is done through operation of one or more valves which control precursor flow.

4. The method of claim 1, wherein the deposited material is a dielectric and the plasma is an oxidative plasma.

5. The method of claim 4, wherein the deposited material contains silicon and the film precursor is a silicon-containing film precursor.

6. The method of claim 1, wherein the removing is performed by purging the reaction chambers with an inert purge gas.

7. The method of claim 1, wherein the removing is performed by applying vacuum to the reaction chambers.

8. The method of claim 1, wherein the plasma is generated within the reaction chambers with application of RF power.

9. The method of claim 1, wherein the plasma is generated remotely and thereafter introduced into the reaction chambers.

10. The method of claim 1, wherein unadsorbed precursor is removed in (ii) from the first reaction chamber while the second substrate is dosed in (i) in the second reaction chamber.

11. The method of claim 10, wherein precursor adsorbed on the first substrate is reacted in (iii) in the first reaction chamber while unadsorbed precursor is removed in (ii) from the second reaction chamber.

12. The method of claim 11, wherein desorbed precursor is removed in (iv) from the first reaction chamber while precursor adsorbed on the second substrate is reacted in (iii) in the second reaction chamber.

13. The method of claim 1, wherein:
 desorbed precursor is removed in (iv) from the first reaction chamber while unadsorbed precursor is removed in (ii) from the second reaction chamber; and
 desorbed precursor is removed in (iv) from the second reaction chamber while unadsorbed precursor is removed in (ii) from the first reaction chamber.

14. The method of claim 1, wherein the dosing in (i) further comprises dosing a third substrate in a third reaction chamber and a fourth substrate in a fourth reaction chamber with precursor flowing from the common source, the timing of said dosing in (i) staggered such that:
 neither the third nor fourth substrates are substantially dosed during either the first or second dosing phases;
 the third substrate is dosed during a third dosing phase during which the first, second, and fourth substrates are not substantially dosed; and
 the fourth substrate is dosed during a fourth dosing phase during which the first, second, and third substrates are not substantially dosed; and
wherein the precursor flows continuously from the common source during the first, second, third, and fourth dosing phases.

15. The method of claim 1, further comprising diverting the film precursor from the reaction chambers when no substrate is being dosed.

16. The method of claim 15, further comprising accumulating film precursor in a precursor accumulation volume during at least some portion of the time when no substrate is being dosed.

17. A substrate processing apparatus for depositing layers of material on multiple semiconductor substrates in multiple reaction chambers, the apparatus comprising:
 a plurality of reaction chambers each having a substrate holder contained therein;
 a valve assembly for directing flow of film precursor to each of the reaction chambers and to a precursor-divert flow path;
 a valve-operated vacuum source for removing precursor from the reaction chambers; and
 a controller comprising a processor, a memory, and machine-readable instructions for operating the valve assembly and vacuum source including instructions for:
  (i) dosing substrates in the reaction chambers with film precursor by introducing the precursor into the reaction chambers and allowing the precursor to adsorb onto the surface of the substrates in an adsorption-limited manner;
  (ii) removing unadsorbed precursor from the reaction chambers;
  (iii) reacting adsorbed precursor with a plasma, after removing unadsorbed precursor, to form a layer of material on the substrates;
  (iv) removing desorbed precursor and/or reaction by-product from the reaction chambers when present after reacting adsorbed precursor; and
  (v) repeating (i) through (iv) multiple times to form multiple layers of material on the multiple substrates in the reaction chambers;
 wherein the dosing in (i) comprises dosing a first substrate in a first reaction chamber of the plurality of reaction chambers and dosing a second substrate in a second reaction chamber of the plurality of reaction chambers with precursor flowing from a common source, the timing of said dosing in (i) staggered such that:
  the first substrate is dosed during a first dosing phase during which the second substrate is not substantially dosed; and
  the second substrate is dosed during a second dosing phase during which the first substrate is not substantially dosed; and
 wherein the precursor flows continuously from the common source during the first and second dosing phases.

18. The apparatus of claim 17, further comprising an RF power source, and wherein the controller further includes instructions for generating the plasma using the RF power source.

19. The apparatus of claim 17, wherein the controller further includes instructions for redirecting the continuous flow of precursor from the first reaction chamber to the second reaction chamber to affect a transition from the first dosing phase to the second dosing phase.

20. A method of depositing layers of material on multiple semiconductor substrates in multiple reaction chambers, the method comprising:
 (i) dosing the substrates in the reaction chambers with a film precursor by introducing the precursor into the reaction chambers and allowing the precursor to adsorb onto the surface of the substrates in an adsorption-limited manner;
 (ii) removing unadsorbed precursor from the reaction chambers;
 (iii) reacting adsorbed precursor with an plasma, after removing unadsorbed precursor, to form a layer of material on the substrates;
 (iv) removing desorbed precursor and/or reaction by-product from the reaction chambers when present after reacting adsorbed precursor; and
 (v) repeating (i) through (iv) multiple times to form multiple layers of material on the multiple substrates in the reaction chambers;
wherein the dosing in (i) comprises staggering the flow of precursor to the reaction chambers by redirecting a continuous flow of precursor from a common source to the reaction chambers such that, during prescribed time intervals, one or more reaction chambers receive a flow of precursor while one or more other reaction chambers do not.

* * * * *